US012787275B2

(12) United States Patent
Kim et al.

(10) Patent No.: US 12,787,275 B2
(45) Date of Patent: Nov. 3, 2026

(54) MEMORY DEVICE INCLUDING VERTICALLY STACKED PERIPHERAL CIRCUIT REGIONS

(71) Applicant: Samsung Electronics Co., Ltd., Suwon-si (KR)

(72) Inventors: Changhun Kim, Suwon-si (KR); Jaeick Son, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 503 days.

(21) Appl. No.: 18/338,757

(22) Filed: Jun. 21, 2023

(65) Prior Publication Data

US 2024/0057329 A1 Feb. 15, 2024

(30) Foreign Application Priority Data

Aug. 9, 2022 (KR) ........................ 10-2022-0099419

(51) Int. Cl.
*H10B 41/41* (2023.01)
*G11C 16/04* (2006.01)
(Continued)

(52) U.S. Cl.
CPC ......... *H10B 41/41* (2023.02); *G11C 16/0483* (2013.01); *H10B 41/27* (2023.02);
(Continued)

(58) Field of Classification Search
CPC ........ H10B 41/41; H10B 41/27; H10B 43/27; H10B 43/40; H10B 41/10; H10B 41/40; H10B 41/50; H10B 43/10; H10B 43/50; G11C 16/0483; G11C 5/025; H01L 23/5226; H01L 23/5283; H01L 25/065;
(Continued)

(56) References Cited

U.S. PATENT DOCUMENTS 3,673,471 A * 6/1972 Klein .................... H10D 48/36
257/407
10,199,375 B2 2/2019 Nojima
(Continued)

FOREIGN PATENT DOCUMENTS

KR 20220005200 A 1/2022
KR 20220056549 A 5/2022

OTHER PUBLICATIONS

Korean Office Action for corresponding Korean Application No. 10-2022-0099419 Mar. 19, 2026.

*Primary Examiner* — Davienne N Monbleau
*Assistant Examiner* — John Patrick Cornely
(74) *Attorney, Agent, or Firm* — HARNESS, DICKEY & PIERCE, P.L.C.

(57) ABSTRACT

A semiconductor device, and more particularly, to a memory device having a three-dimensional structure are provided. The memory device various example embodiments includes a cell region and a peripheral circuit region that at least partially overlaps the cell region when viewed in plan view. The peripheral circuit region includes a first sub-peripheral circuit region including a substrate and a circuit element on the substrate, and a second sub-peripheral circuit region that is stacked on the first sub-peripheral circuit region in a vertical direction and that includes a sub-poly structure and a circuit element on the sub-poly structure.

20 Claims, 14 Drawing Sheets

(51) Int. Cl.

| | |
|---|---|
| ***H10B 41/27*** | (2023.01) |
| ***H10B 43/27*** | (2023.01) |
| ***H10B 43/40*** | (2023.01) |
| ***H10W 20/41*** | (2026.01) |
| ***H10W 20/42*** | (2026.01) |
| ***H10W 90/00*** | (2026.01) |
| *H10W 90/20* | (2026.01) |

(52) U.S. Cl.
CPC ............. *H10B 43/27* (2023.02); *H10B 43/40* (2023.02); *H10W 20/42* (2026.01); *H10W 20/435* (2026.01); *H10W 90/00* (2026.01); *H10W 90/297* (2026.01)

(58) Field of Classification Search
CPC ......... H01L 2225/06541; H01L 23/481; H01L 25/18
See application file for complete search history.

(56) References Cited

U.S. PATENT DOCUMENTS

| | | | | |
|---|---|---|---|---|
| 10,985,142 | B2 | 4/2021 | Xiao | |
| 11,189,625 | B2 | 11/2021 | Kim et al. | |
| 11,270,987 | B2 | 3/2022 | Park et al. | |
| 11,296,113 | B2 | 4/2022 | Kim et al. | |
| 11,302,396 | B2 | 4/2022 | Kwon et al. | |
| 2022/0005820 | A1* | 1/2022 | Kim | H10B 41/40 |
| 2022/0052066 | A1 | 2/2022 | Kim | |
| 2022/0102334 | A1* | 3/2022 | Kim | H10B 43/50 |
| 2022/0130846 | A1* | 4/2022 | Kim | H10B 41/27 |
| 2022/0238541 | A1* | 7/2022 | Byun | H10N 19/00 |
| 2023/0005541 | A1* | 1/2023 | Yang | G11C 16/0483 |
| 2023/0005861 | A1* | 1/2023 | Wang | H10B 43/35 |

* cited by examiner

MEMORY DEVICE INCLUDING VERTICALLY STACKED PERIPHERAL CIRCUIT REGIONS

CROSS-REFERENCE TO RELATED APPLICATIONS

This application claims priority under 35 U.S.C. § 119 to Korean Patent Application No. 10-2022-0099419 filed on Aug. 9, 2022, in the Korean Intellectual Property Office, the disclosures of which are incorporated by reference herein in their entireties.

BACKGROUND

Various example embodiments described herein relate to a semiconductor device, and more particularly, relate to a memory device having a three-dimensional structure.

Memory devices are used to store data. The memory devices may be classified into a volatile memory device and a non-volatile memory device. As an example of the non-volatile memory device, a flash memory device may be used in one or more of a mobile phone, a digital camera, a mobile computer device, a stationary computer device, and other devices. Recently, with the multi-functionalization of information and communication devices, high-capacity and high-integration memory devices have been required or desired. Accordingly, a three-dimensional (3D) non-volatile memory device including a plurality of word lines vertically stacked on a substrate has been proposed.

As the number of stages or levels of the word lines stacked on the substrate in the 3D non-volatile memory device is sharply increased, the area of a cell region required or desired to provide the same capacity is rapidly decreasing. However, the entire area of a peripheral circuit region required or used to provide the same capacity is not significantly changed. Therefore, the percentage of the area occupied by the peripheral circuit region in the memory device when viewed on a plane is sharply increased. This may cause a waste of space in the memory device and may be an impediment to high-integration design of the memory device.

SUMMARY

Various example embodiments provide a memory device capable of decreasing an area occupied by a peripheral circuit region when viewed on a plane.

According to some example embodiments, a memory device includes a cell region, and a peripheral circuit region at least partially overlapping the cell region when viewed in plan view. The peripheral circuit region includes a first sub-peripheral circuit region including a substrate and a first circuit element on the substrate, and a second sub-peripheral circuit region stacked on the first sub-peripheral circuit region in a vertical direction, the second sub-peripheral circuit region including a sub-poly structure and a second circuit element on the sub-poly structure.

Alternatively or additionally, according to some example embodiments, a memory device includes a first chip having a peripheral circuit region arranged therein; and a second chip connected with the first chip by a bond to at least partially overlap the first chip on a plane, the second chip having a cell region arranged therein. The peripheral circuit region includes a first sub-peripheral circuit region including a substrate and a first circuit element on the substrate, a second sub-peripheral circuit region stacked on the first sub-peripheral circuit region in a vertical direction, the second sub-peripheral circuit region including a first sub-poly structure and a second circuit element on the first sub-poly structure, and a third sub-peripheral circuit region stacked on the second sub-peripheral circuit region in the vertical direction, the third sub-peripheral circuit region including a second sub-poly structure and a third circuit element on the second sub-poly structure. The substrate is a silicon substrate, and the first sub-poly structure and the second sub-poly structure include doped polysilicon.

Alternatively or additionally, according to some example embodiments, a memory device includes a first sub-peripheral circuit region including a substrate and a first circuit element on the substrate, a second sub-peripheral circuit region vertically stacked on the first sub-peripheral circuit region, the second sub-peripheral circuit region including a first sub-poly structure and a second circuit element on the first sub-poly structure, a third sub-peripheral circuit region vertically stacked on the second sub-peripheral circuit region, the third sub-peripheral circuit region including a second sub-poly structure and a third circuit element on the second sub-poly structure, and a cell region vertically stacked on the third sub-peripheral circuit region, the cell region including a third sub-poly structure and a plurality of word lines vertically stacked on the third sub-poly structure.

BRIEF DESCRIPTION OF THE FIGURES

The above and other objects and features will become apparent by describing in detail various example embodiments thereof with reference to the accompanying drawings.

DETAILED DESCRIPTION

Hereinafter, some example embodiments will be described clearly and in detail to such an extent that those of ordinary skill in the art may easily implement.

Figure 1:
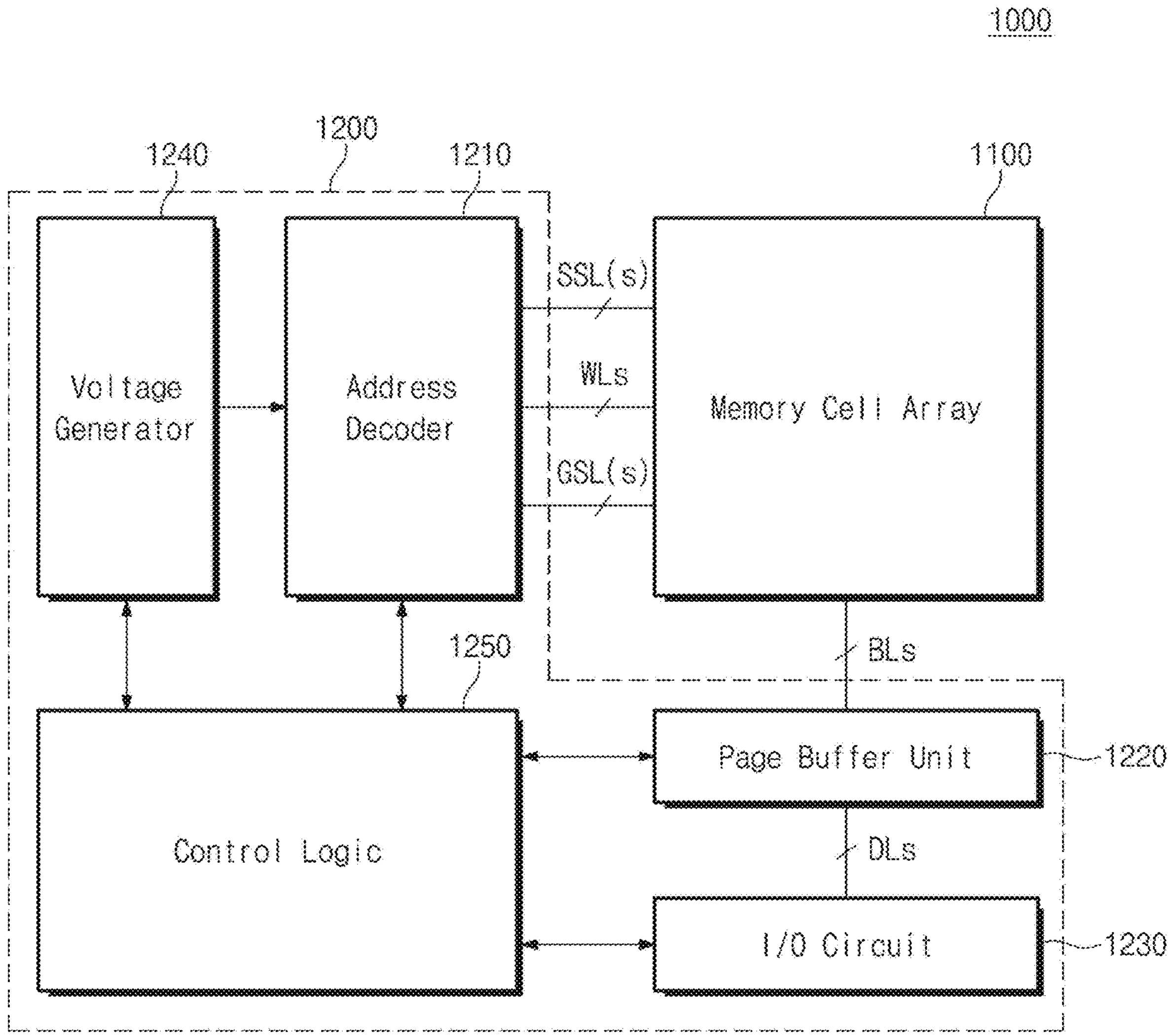
FIG. 1 is a block diagram illustrating a memory device according to various example embodiments.

FIG. 1 is a block diagram illustrating a memory device 1000 according to various example embodiments.

Referring to FIG. 1, the memory device 1000 includes a memory cell array 1100 and a peripheral circuit 1200.

The memory cell array 1100 may be connected to a page buffer circuit 1220 through bit lines BL and may be connected to an address decoder 1210 through word lines WL, string selection lines SSL, and ground selection lines GSL. The memory cell array 1100 may include a plurality of memory cells. For example, the memory cells may be or may include flash memory cells. The plurality of memory cells may be single-level cells, and/or may be multi-level cells; example embodiments are not limited thereto. Additionally or alternatively, the plurality of memory cells may be or may include one or more of resistive memory cells, such as resistive RAM (ReRAM), phase change RAM (PRAM), or magnetic RAM (MRAM).

The memory cell array 1100 may include a plurality of memory blocks. Each of the memory blocks may have a two-dimensional structure or a three-dimensional structure. In a memory block having a two-dimensional structure (or, a horizontal structure), memory cells are formed or arranged in a direction parallel to a substrate. However, in a memory block having a three-dimensional structure (or, a vertical structure), memory cells are formed in a direction perpendicular to a substrate. Single-bit or multi-bit (such as two or more bits) of data may be stored in each of the memory cells.

The peripheral circuit 1200 is disposed adjacent to the memory cell array 1100. For example, the peripheral circuit 1200 may be disposed in a direction perpendicular to the memory cell array 1100 to overlap the memory cell array 1100 when viewed on a plane. The peripheral circuit 1200 may include the address decoder 1210, the page buffer circuit 1220, an input/output circuit 1230, a voltage generator 1240, and control logic 1250.

The address decoder 1210 is connected with the memory cell array 1100 through row lines. The row lines may include selection lines, such as the string selection lines SSL and the ground selection lines GSL, and the word lines WL. In response to control of the control logic 1250, the address decoder 1210 may select one or more of the plurality of memory blocks, may select one or more of word lines WL of the selected memory block, and may select one or more of the plurality of string selection lines SSL.

The page buffer circuit 1220 is connected with the memory cell array 1100 through column lines. The column lines may include, for example, the bit lines BL. The page buffer circuit 1220 may temporarily store data to be programmed in a selected page or data read from the selected page.

The input/output circuit 1230 may be connected with the page buffer circuit 1220 through data lines DL and may be connected with the outside through an input/output line. The input/output circuit 1230 may receive data to be programmed in a selected memory cell of the memory cell array 1100 from the outside in a program operation, and may transmit data read from the selected memory cell to the outside in a read operation.

The voltage generator 1240 receives internal power from the control logic 1250 and generates a row line voltage required or expected to read or write data. The row line voltage may be provided to the string selection lines SSL, the word lines WL, and/or the ground selection lines GSL through the address decoder 1210.

The control logic 1250 may control overall operation of the memory device 1000.

In various example embodiments, the memory device 1000 may include a cell region and a peripheral circuit region. Here, the cell region may refer to a region in which the memory cell array 1100 and the row lines and the column lines connected thereto are disposed. The peripheral circuit region may refer to a region in which circuit elements constituting the peripheral circuit 1200 are disposed.

As will be described below, the peripheral circuit region according to various example embodiments may be disposed in a direction perpendicular to the cell region. Accordingly, the peripheral circuit region may overlap the cell region when viewed on the plane. In addition, the peripheral circuit region according to various example embodiments may include a plurality of vertically stacked sub-peripheral circuit regions. That is, the peripheral circuit region may be formed of multiple layers. Accordingly, the peripheral circuit region according to various example embodiments may occupy a smaller area on the plane than a peripheral circuit region formed of a single layer.

Figure 2A:
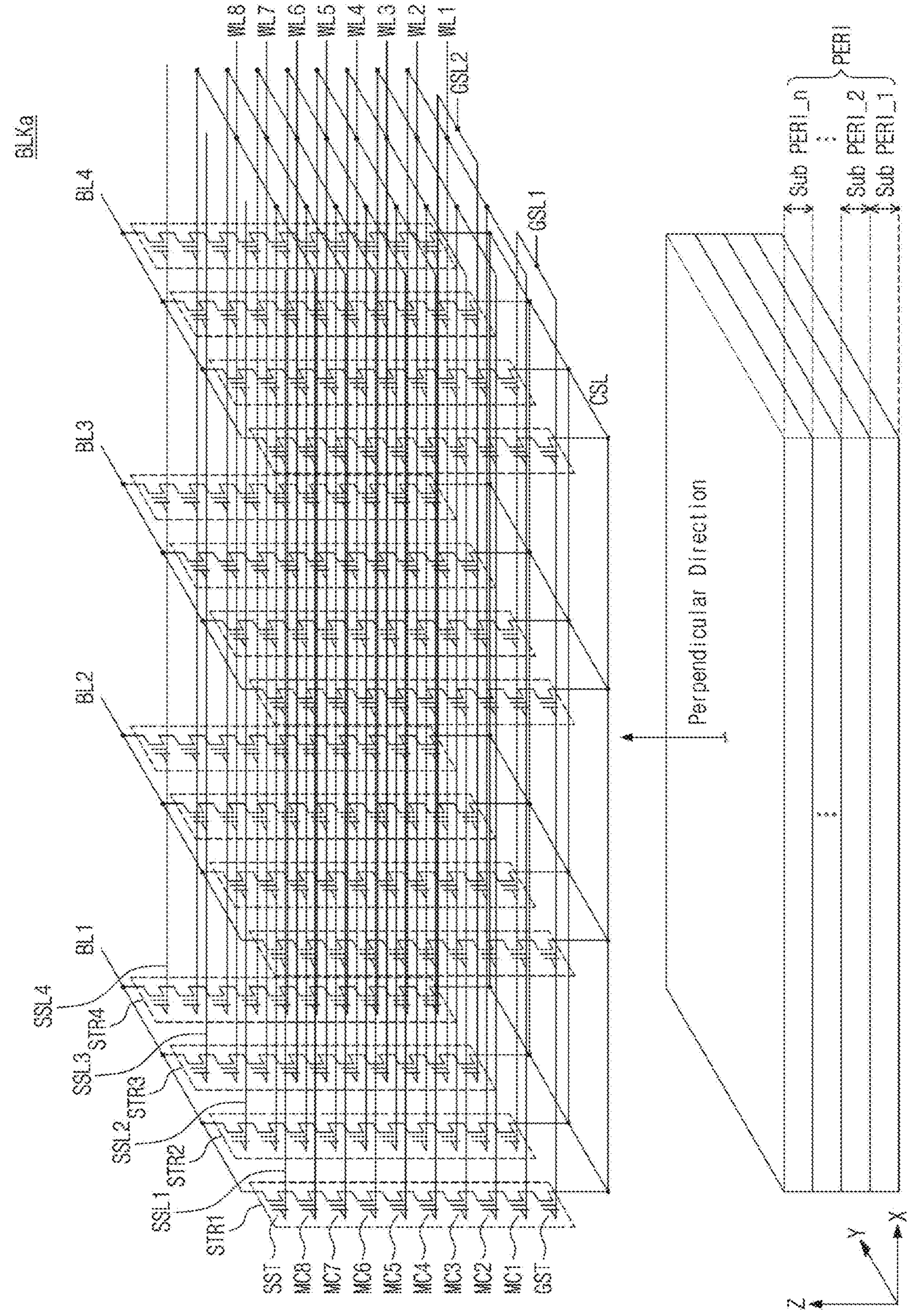
FIG. 2A is a view illustrating one example of one memory block among memory blocks included in a memory cell array of FIG. 1 and a peripheral circuit corresponding to the one memory block.
Figure 2B:
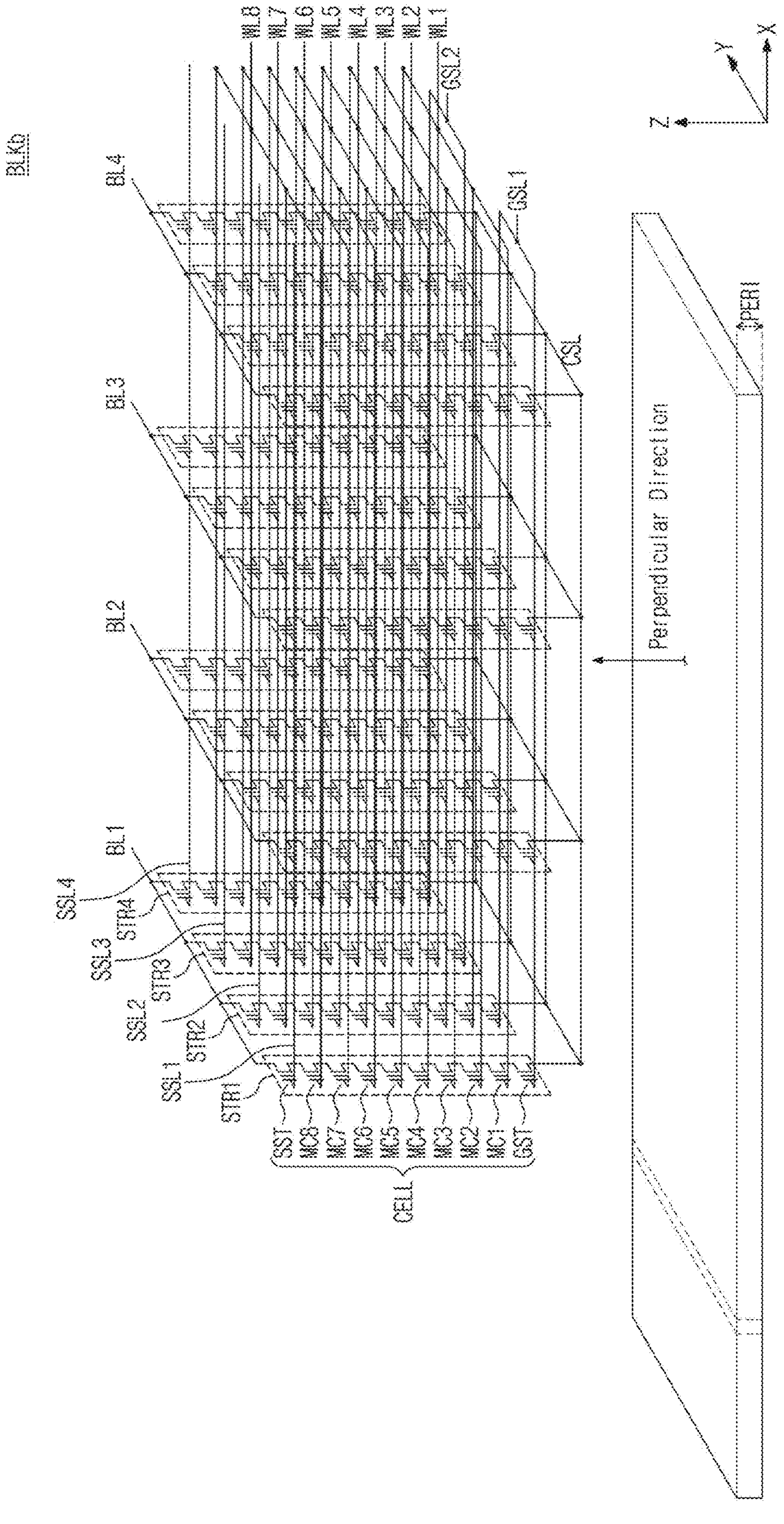
FIG. 2B is a view illustrating one example a memory block and a peripheral circuit corresponding thereto in a general case.

FIG. 2A is a view illustrating one example of one memory block BLKa among the memory blocks included in the memory cell array 1100 of FIG. 1 and a peripheral circuit corresponding to the one memory block BLKa. FIG. 2B is a view illustrating one example of a memory block BLKb and a peripheral circuit corresponding thereto in a general case.

Referring to FIG. 2A, the memory block BLKa may include a plurality of strings STR arranged in rows and columns. The plurality of strings STR may be commonly connected to a common source line CSL. In FIG. 2A, the common source line CSL is illustrated as being connected to lower ends of the strings STR. However, it may be sufficient that the common source line CSL is electrically connected to the lower ends of the strings STR, and the common source line CSL is not limited to being physically located at the lower ends of the strings STR. For example, in FIG. 2A, the strings STR are illustrated as being arranged in a 4×4 array. However, the memory block BLKa may include more or fewer strings.

Strings in each row may be commonly connected to one or both of a ground selection line GSL1 or GSL2. For example, strings in the first and second rows may be commonly connected to the first ground selection line GSL1, and strings in the third and fourth rows may be commonly connected to the second ground selection line GSL2. However, this is illustrative. Four different ground selection lines may be provided, and strings in each row may be implemented to be connected to different ground selection lines.

Alternatively or additionally, strings in each row may be connected to corresponding string selection lines among first to fourth string selection lines SSL1 to SSL4. Cell strings in each column may be connected to a corresponding bit line among first to fourth bit lines BL1 to BL4.

Each string may include at least one ground selection transistor GST connected to the ground selection line GSL1 or GSL2, a plurality of memory cells MC1 to MC8 connected to a plurality of word lines WL1 to WL8, respectively, and string selection transistors SST connected to the string selection lines SSL1, SSL2, SSL3, and SSL4, respectively.

In each string, the ground selection transistor GST, the memory cells MC1 to MC8, and the string selection transistors SST may be connected in series in a direction perpendicular to the peripheral circuit region, and may be sequentially stacked in the direction perpendicular to the peripheral circuit region. In each string STR, at least one of the memory cells MC1 to MC8 may be used as a dummy memory cell. The dummy memory cell may not be programmed (e.g., may be prohibited from being programmed), or may be programmed differently from the memory cells MC1 to MC8. The dummy memory cell may provide support, e.g. mechanical support, to the semiconductor device.

Continuously referring to FIG. 2A, at least a part of the peripheral circuit 1200 (refer to FIG. 1) may be disposed on a lower side of the memory block BLKa. Circuit elements of the peripheral circuit 1200 disposed on the lower side of the memory block BLKa may form the peripheral circuit region PERI.

In some example embodiments, the peripheral circuit region PERI may include first to nth sub-peripheral circuit regions Sub PERI1 to Sub PERIn extending in a first direction (an X-axis direction) and a second direction (a Y-axis direction). The first to nth sub-peripheral circuit regions Sub PERI1 to Sub PERIn may be stacked in a third direction (a Z-axis direction). Accordingly, the area occupied by the peripheral circuit region PERI when viewed on the plane may be decreased.

In more detail, in the general case, as illustrated in FIG. 2B, the peripheral circuit is disposed in a single layer on a lower side of the memory block BLKb to form a peripheral circuit region. In the case of the peripheral circuit region formed of a single layer as described above, circuit elements constituting or included in the peripheral circuit are all disposed at the same height along the plane defined by the first and second directions (the X-axis and Y-axis directions). As the number of stages of word lines of the memory block is increased, the area occupied by a cell region on the plane to provide the same capacity is gradually reduced, whereas the area occupied by the peripheral circuit region is not changed. For example, as the number of stages of the word lines is increased, the percentage of the area occupied on the plane by the peripheral circuit region formed of a single layer is relatively gradually increased.

In this case, as illustrated in FIG. 2B, a region in which memory cells of the cell region are not disposed and only the circuit elements of the peripheral circuit region are disposed is gradually increased when viewed on the plane. Accordingly, a wasted space of the cell region in which the memory cells are not disposed is increased, and it is or may be difficult to make a memory device compact.

In contrast, as illustrated in FIG. 2A, the peripheral circuit region PERI according to various example embodiments includes the plurality of sub-peripheral circuit regions Sub PERI1 to Sub PERIn, and the plurality of sub-peripheral circuit regions Sub PERI1 to Sub PERIn are stacked in the third direction (the Z-axis direction). Accordingly, the peripheral circuit region PERI according to various example embodiments may occupy a smaller area on the plane than the peripheral circuit region formed of a single layer. Accordingly, a wasted space may be reduced or minimized, and the memory device 1000 may be made compact.

Figure 3:
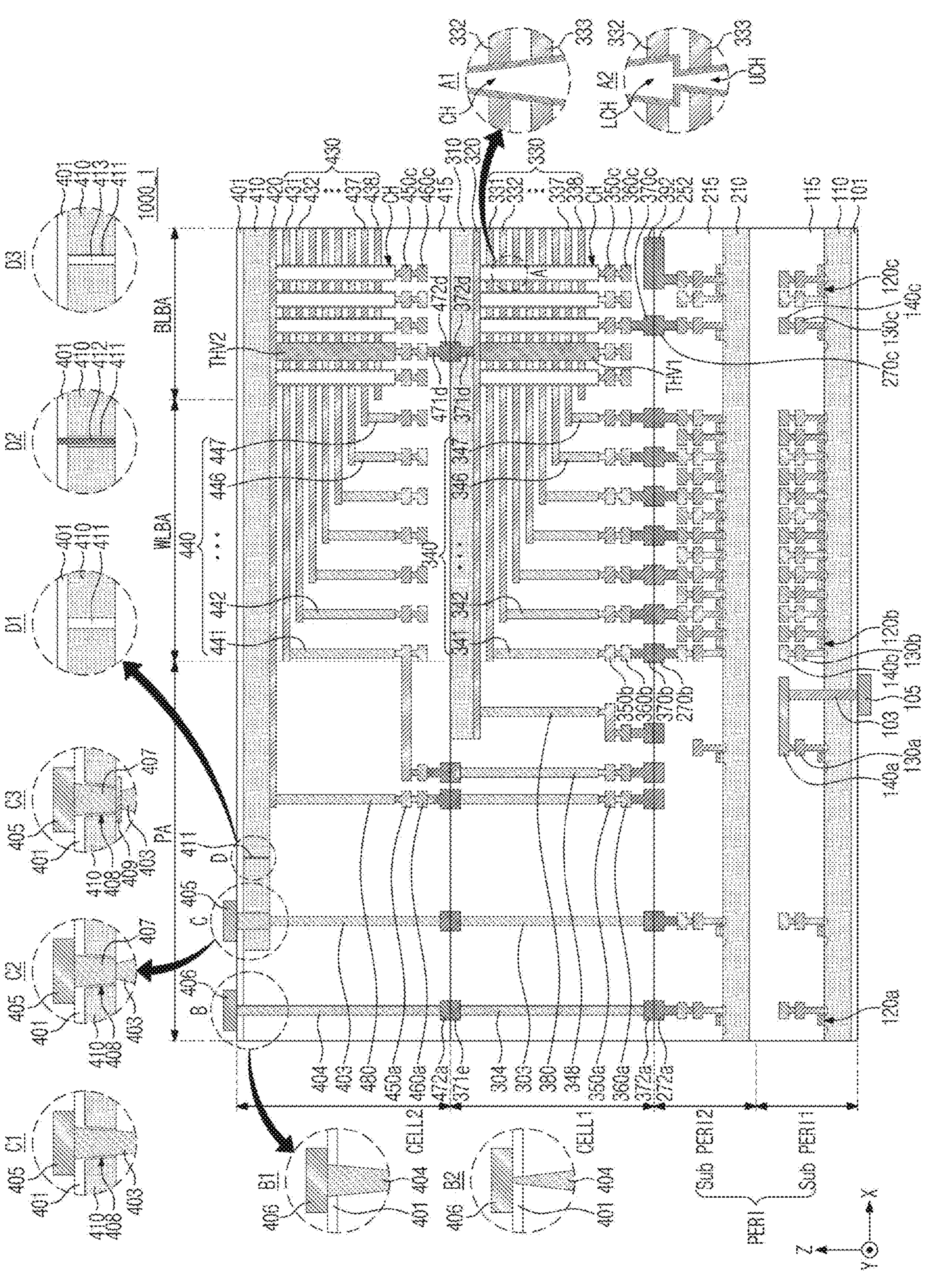
FIG. 3 is a view illustrating one example of a memory device according to various example embodiments.

FIG. 3 is a view illustrating one example of a memory device 1000_1 according to various example embodiments. For convenience of description, it is assumed that the memory device 1000_1 of FIG. 3 includes first and second cell regions CELL1 and CELL2 and first and second sub-peripheral circuit regions Sub PERI1 and Sub PERI2 stacked in the third direction (the Z-axis direction).

Referring to FIG. 3, the memory device 10001 may have a chip-to-chip (C2C) structure. Here, the C2C structure may refer to a structure in which at least one upper chip including a cell region CELL and at least one lower chip including a peripheral circuit region PERI are separately manufactured and then connected to each other by a bonding method. For example, the bonding method may refer to a method of electrically and/or physically connecting a bonding metal pattern formed on the uppermost metal layer of the upper chip and a bonding metal pattern formed on the uppermost metal layer of the lower chip. For example, in a case in which the bonding metal patterns are formed of copper (Cu), the bonding method may be or may include a Cu-to-Cu bonding method. Alternatively or additionally, the bonding metal patterns may be formed of aluminum (Al) and/or tungsten (W).

The memory device 10001 may include at least one upper chip including a cell region. For example, as illustrated in FIG. 3, the memory device 10001 may be implemented to include two upper chips. However, this is illustrative, and the number of upper chips is not limited thereto. In the case in which the memory device 1000_1 is implemented to include two upper chips, the memory device 1000_1 may be manufactured by separately manufacturing a first upper chip including the first cell region CELL1, a second upper chip including the second cell region CELL2, and a lower chip including a peripheral circuit region PERI, and thereafter connecting the first upper chip, the second upper chip, and the lower chip by a first bonding method. The first upper chip may be turned over and connected to the lower chip by the bonding method, and the second upper chip may also be turned over and connected to the first upper chip by a second bonding method, which may or may not be the same as, e.g. may or may not use the same material as, the first bonding method. In the following description, upper portions and lower portions of the first and second upper chips are defined based on before the first upper chip and the second upper chip are turned over. For example, in FIG. 3, an upper portion of the lower chip refers to an upper portion defined based on a +Z-axis direction, and the upper portions of the first and second upper chips refer to upper portions defined based on a −Z-axis direction. However, this is illustrative, and only one of the first upper chip and the second upper chip may be turned over and connected by the bonding method.

Each of the peripheral circuit region PERI and the first and second cell regions CELL1 and CELL2 of the memory device 1000_1 may include an external pad bonding region PA, a word line bonding region WLBA, and a bit line bonding region BLBA.

The peripheral circuit region PERI may include the first and second sub-peripheral circuit regions Sub PERI1 and Sub PERI2 vertically stacked in the Z-axis direction. However, this is illustrative, and the number of vertically stacked sub-peripheral circuit regions is not limited thereto.

The first sub-peripheral circuit region Sub PERI1 may include a first substrate 110 and a plurality of circuit elements 120*a*, 220*b*, and 220*c* formed on the first substrate 110.

The first substrate 110 may have a plate shape expanded along the plane defined by the first and second directions (the X-axis direction and the Y-axis direction). The first substrate 110 may be or may include a semiconductor substrate. For example, the first substrate 110 may be or include a bulk silicon substrate, a silicon-on-insulator substrate, a germanium substrate, a germanium-on-insulator substrate, a silicon-germanium substrate, and/or an epitaxial thin film formed through a selective epitaxial growth method.

An interlayer insulating layer 115 including one or more insulating layers may be provided on the plurality of circuit elements 120*a*, 120*b*, and 120*c*, and a plurality of metal lines connecting the plurality of circuit elements 120*a*, 120*b*, and 120*c* may be provided in the interlayer insulating layer 115. For example, the plurality of metal lines may include first metal lines 130*a*, 130*b*, and 130*c* connected with the plurality of circuit elements 120*a*, 120*b*, and 120*c*, respectively, and second metal lines 140*a*, 140*b*, and 140*c* formed on the first metal lines 130*a*, 130*b*, and 130*c*. The plurality of metal lines may be formed of at least one of various conductive materials. For example, the first metal lines 130*a*, 130*b*, and 130*c* may be formed of or include tungsten having a relatively high electrical resistivity, and the second metal lines 140*a*, 140*b*, and 140*c* may be formed of or include copper having a relatively low electrical resistivity.

Only the first metal lines 130*a*, 130*b*, and 130*c* and the second metal lines 140*a*, 140*b*, and 140*c* are illustrated and described herein. However, without being limited thereto, one or more additional metal lines may be further formed on the second metal lines 140*a*, 140*b*, and 140*c*. In this case, the second metal lines 140*a*, 140*b*, and 140*c* may be formed of or include aluminum At least some of the additional metal lines formed on the second metal lines 140*a*, 140*b*, and 140*c* may be formed of or include copper having a lower electrical resistivity than the aluminum of the second metal lines 140*a*, 140*b*, and 140*c*.

The interlayer insulating layer 115 may be disposed on the first substrate 110 and may include an insulating material, such as silicon oxide or silicon nitride.

The second sub-peripheral circuit region Sub PERI2 may include a sub-poly structure 210 and a plurality of circuit elements 220*a*, 220*b*, and 220*c* formed on the sub-poly structure 210.

The sub-poly structure 210 may have a plate shape expanded along the plane defined by the first and second directions (the X-axis direction and the Y-axis direction). The sub-poly structure 210 may include polysilicon and/or a conductive material. For example, the sub-poly structure 210 may include doped polysilicon. The sub-poly structure 210 may be a single layer or a multi-layer.

An interlayer insulating layer 215 including one or more insulating layers may be provided on the plurality of circuit elements 220*a*, 220*b*, and 220*c*, and a plurality of metal lines connecting the plurality of circuit elements 220*a*, 220*b*, and 220*c* may be provided in the interlayer insulating layer 215. Furthermore, although not illustrated, a part of the plurality of circuit elements 220*a*, 220*b*, and 220*c* on the sub-poly structure 210 may be electrically connected with a part of the plurality of circuit elements 120*a*, 120*b*, and 120*c* on the first substrate 110.

Each of the first and second cell regions CELL1 and CELL2 may include at least one memory block. The first cell region CELL1 may include a second substrate 310 and a common source line 320. A plurality of word lines 330 (331 to 338) may be stacked on the second substrate 310 in a direction (the Z-axis direction) perpendicular to an upper surface of the second substrate 310. String selection lines and a ground selection line may be disposed on and under the word lines 330, and the plurality of word lines 330 may be disposed between the string selection lines and the ground selection line. Likewise, the second cell region CELL2 may include a third substrate 410 and a common source line 420, and a plurality of word lines 430 (431 to 438) may be stacked in a direction (the Z-axis direction) perpendicular to an upper surface of the third substrate 410. The second substrate 310 and the third substrate 410 may be formed of various materials and may be or may include, for example, silicon substrates, silicon-germanium substrates, germanium substrates, or substrates having mono-crystalline epitaxial layers grown on mono-crystalline silicon substrates. A plurality of channel structures CH may be formed in the first and second cell regions CELL1 and CELL2.

In various example embodiments, as illustrated in A1, the channel structure CH may be provided in the bit line bonding region BLBA and may extend in the direction perpendicular to the upper surface of the second substrate 310 to penetrate the word lines 330, the string selection lines, and the ground selection line. The channel structure CH may include a data storage layer, a channel layer, and a buried insulating layer. The channel layer may be electrically connected with a first metal line 350*c* and a second metal line 360*c* in the bit line bonding region BLBA. For example, the second metal line 360*c* may be or correspond to a bit line and may be connected to the channel structure CH through the first metal line 350*c*. The bit line 360*c* may extend in the first direction (the X-axis direction) parallel to the upper surface of the second substrate 310.

In various example embodiments, as illustrated in A2, the channel structure CH may include a lower channel LCH and an upper channel UCH connected to each other. For example, the channel structure CH may be formed through a process for the lower channel LCH and a process for the upper channel UCH. The lower channel LCH may extend in the direction perpendicular to the upper surface of the second substrate 310 and may penetrate the common source line 320 and the lower word lines 331 and 332. The lower channel LCH may include a data storage layer, a channel layer, and a buried insulating layer and may be connected with the upper channel UCH. The upper channel UCH may penetrate the upper word lines 333 to 338. The upper channel UCH may include a data storage layer, a channel layer, and a buried insulating layer, and the channel layer of the upper channel UCH may be electrically connected with the first metal line 350*c* and the second metal line 360*c*. As the length of a channel is increased, it may be difficult to form a channel having a constant width due to process reasons, for example due to process reasons associated with anisotropic etching. The memory device 1000_1 according to various example embodiments may include a channel having improved width uniformity through the lower channel LCH and the upper channel UCH formed by sequential processes.

In the case in which the channel structure CH includes the lower channel LCH and the upper channel UCH as illustrated in A2, a word line located near the boundary between the lower channel LCH and the upper channel UCH may be a dummy word line. For example, the word line 332 and the word line 333 that form the boundary between the lower channel LCH and the upper channel UCH may be dummy word lines. In this case, data may not be stored in memory cells connected to the dummy word lines. Alternatively or additionally, the number of pages corresponding to the memory cells connected to the dummy word lines may be smaller than the number of pages corresponding to memory cells connected to normal word lines. A voltage level applied to the dummy word lines may differ from a voltage level applied to the normal word lines, and thus an influence of a non-uniform channel width between the lower channel LCH and the upper channel UCH on an operation of the memory device may be reduced.

Meanwhile, in FIG. 3, it is illustrated that the number of lower word lines 331 and 332 penetrated by the lower channel LCH is smaller than the number of upper word lines 333 to 338 penetrated by the upper channel UCH. However, this is illustrative, and example embodiments are not limited thereto. In another example, the number of lower word lines penetrated by the lower channel LCH may be equal to or larger than the number of upper word lines penetrated by the upper channel UCH. Furthermore, the above-described structure and connection relationship of the channel structure CH disposed in the first cell region CELL1 may be identically applied to the channel structure CH disposed in the second cell region CELL2.

In the bit line bonding region BLBA, a first through-electrode THV1 may be provided in the first cell region CELL1, and a second through-electrode THV2 may be provided in the second cell region CELL2. As illustrated in FIG. 3, the first through-electrode THV1 may penetrate the common source line 320 and the plurality of word lines 330. However, this is illustrative, and the first through-electrode THV1 may additionally penetrate the second substrate 310. The first through-electrode THV1 may include a conductive material. Alternatively, the first through-electrode THV1 may include a conductive material surrounded by an insulating material. The second through-electrode THV2 may have the same shape and/or the same structure as the first through-electrode THV1.

In various example embodiments, the first through-electrode THV1 and the second through-electrode THV2 may be electrically connected through a first through-metal pattern 372*d* and a second through-metal pattern 472*d*. The first through-metal pattern 372*d* may be formed on a lower side of the first upper chip including the first cell region CELL1, and the second through-metal pattern 472*d* may be formed on an upper side of the second upper chip including the second cell region CELL2. The first through-electrode THV1 may be electrically connected with the first metal line 350*c* and the second metal line 360*c*. A lower VIA 371*d* may be formed between the first through-electrode THV1 and the first through-metal pattern 372*d*, and an upper VIA 471*d* may be formed between the second through-electrode THV2 and the second through-metal pattern 472*d*. The first through-metal pattern 372*d* and the second through-metal pattern 472*d* may be connected by a bonding method.

Furthermore, in the bit line bonding region BLBA, an upper metal pattern 252 may be formed on the uppermost metal layer of the peripheral circuit region PERI, and an upper metal pattern 392 having the same shape as the upper metal pattern 252 may be formed on the uppermost metal layer of the first cell region CELL1. The upper metal pattern 392 of the first cell region CELL1 and the upper metal pattern 252 of the peripheral circuit region PERI may be electrically connected to each other by a bonding method. In the bit line bonding region BLBA, the bit line 360*c* may be electrically connected with a page buffer included in the peripheral circuit region PERI. For example, some of the circuit elements 220*c* of the peripheral circuit region PERI may provide a page buffer, and the bit line 360*c* may be electrically connected with the circuit elements 220*c* providing the page buffer through an upper bonding metal 370*c* of the first cell region CELL1 and an upper bonding metal 270*c* of the peripheral circuit region PERI.

Still referring to FIG. 3, in the word line bonding region WLBA, the word lines 330 of the first cell region CELL1 may extend in the second direction (the Y-axis direction) parallel to the upper surface of the second substrate 310 and may be connected with a plurality of cell contact plugs 340 (341 to 347). A first metal line 350*b* and a second metal line 360*b* may be sequentially connected to upper portions of the cell contact plugs 340 connected to the word lines 330. In the word line bonding region WLBA, the cell contact plugs 340 may be connected with the peripheral circuit region PERI through an upper bonding metal 370*b* of the first cell region CELL1 and an upper bonding metal 270*b* of the peripheral circuit region PERI.

The cell contact plugs 340 may be electrically connected with a row decoder included in the peripheral circuit region PERI. For example, some of the circuit elements 220*b* of the peripheral circuit region PERI may provide a row decoder, and the cell contact plugs 340 may be electrically connected with the circuit elements 220*b* providing the row decoder through the upper bonding metal 370*b* of the first cell region CELL1 and the upper bonding metal 270*b* of the peripheral circuit region PERI. In various example embodiments, an operating voltage of the circuit elements 220*b* that provide the row decoder may differ from an operating voltage of the circuit elements 220*c* that provide the page buffer. For example, the operating voltage of the circuit elements 220*c* that provide the page buffer may be greater than or less than the operating voltage of the circuit elements 220*b* that provide the row decoder.

Likewise, in the word line bonding region WLBA, the word lines 430 of the second cell region CELL2 may extend in the second direction (the Y-axis direction) parallel to the upper surface of the third substrate 410 and may be connected with a plurality of cell contact plugs 440 (441 to 447). The cell contact plugs 440 may be connected with the peripheral circuit region PERI through an upper metal pattern of the second cell region CELL2, a lower metal pattern and an upper metal pattern of the first cell region CELL1, and a cell contact plug 348.

In the word line bonding region WLBA, the upper bonding metal 370*b* may be formed in the first cell region CELL1, and the upper bonding metal 270*b* may be formed in the peripheral circuit region PERT. The upper bonding metal 370*b* of the first cell region CELL1 and the upper bonding metal 270*b* of the peripheral circuit region PERI may be electrically connected to each other by a bonding method. The upper bonding metal 370*b* and the upper bonding metal 270*b* may be formed of one or more of aluminum, copper, or tungsten.

In the external pad bonding region PA, a lower metal pattern 371*e* may be formed in a lower portion of the first cell region CELL1, and an upper metal pattern 472*a* may be formed in an upper portion of the second cell region CELL2. The lower metal pattern 371*e* of the first cell region CELL1 and the upper metal pattern 472*a* of the second cell region CELL2 may be connected by a bonding method in the external pad bonding region PA. Likewise, an upper metal pattern 372*a* may be formed in an upper portion of the first cell region CELL1, and an upper metal pattern 272*a* may be formed in an upper portion of the peripheral circuit region PERI. The upper metal pattern 372*a* of the first cell region CELL1 and the upper metal pattern 272*a* of the peripheral circuit region PERI may be connected to each other by a bonding method.

Common source line contact plugs 380 and 480 may be disposed in the external pad bonding region PA. The common source line contact plugs 380 and 480 may be formed of a conductive material, such as one or more of metal, a metal compound, or doped poly-silicon. The common source line contact plug 380 of the first cell region CELL1 may be electrically connected with the common source line 320, and the common source line contact plug 480 of the second cell region CELL2 may be electrically connected with the common source line 420. A first metal line 350*a* and a second metal line 360*a* may be sequentially stacked on an upper portion of the common source line contact plug 380 of the first cell region CELL1, and a first metal line 450*a* and a second metal line 460*a* may be sequentially stacked on an upper portion of the common source line contact plug 480 of the second cell region CELL2.

Input/output pads 105, 405, and 406 may be disposed in the external pad bonding region PA. Referring to FIG. 3, a lower insulating layer 101 may cover a lower surface of the first substrate 110, and the first input/output pad 105 may be formed on the lower insulating layer 101. The first input/output pad 105 may be connected with at least one of the plurality of circuit elements 120*a* disposed in the first sub-peripheral circuit region Sub PERI1 through a first input/output contact plug 103 and may be separated from the first substrate 110 by the lower insulating layer 101. In addition, a side insulating layer may be disposed between the first input/output contact plug 103 and the first substrate 110 and may electrically isolate the first input/output contact plug 103 from the first substrate 110.

An upper insulating layer 401 may be formed on the third substrate 410 to cover the upper surface of the third substrate 410. The second input/output pad 405 and/or the third input/output pad 406 may be disposed on the upper insulating layer 401. The second input/output pad 405 may be connected with at least one of the plurality of circuit elements 220*a* disposed in the peripheral circuit region PERI through second input/output contact plugs 403 and 303, and the third input/output pad 406 may be connected with at least one of the plurality of circuit elements 220*a* disposed in the peripheral circuit region PERI through third input/output contact plugs 404 and 304.

In various example embodiments, the third substrate 410 may not be disposed or arranged in the regions in which the input/output contact plugs are disposed or arranged. For example, as illustrated in B1 and B2, the third input/output contact plug 404 may be separated from the third substrate 410 in a direction parallel to the upper surface of the third substrate 410. The third input/output contact plug 404 may penetrate an interlayer insulating layer 415 of the second cell region CELL2 and may be connected to the third input/output pad 406. In this case, the third input/output contact plug 404 may be formed through various processes.

For example, as illustrated in B1, the third input/output contact plug 404 may extend in the third direction (the Z-axis direction) and may have an increasing diameter toward the upper insulating layer 401. That is, while the channel structure CH described with reference to A1 has a decreasing diameter toward the upper insulating layer 401, the third input/output contact plug 404 may have an increasing diameter toward the upper insulating layer 401. For example, the third input/output contact plug 404 may be formed after the second cell region CELL2 and the first cell region CELL1 are coupled by a bonding method.

For example, as illustrated in B2, the third input/output contact plug 404 may extend in the third direction (the Z-axis direction) and may have a decreasing diameter toward the upper insulating layer 401. That is, likewise to the channel structure CH, the third input/output contact plug 404 may have a decreasing diameter toward the upper insulating layer 401. For example, the third input/output contact plug 404 may be formed together with the cell contact plugs 440 before the second cell region CELL2 and the first cell region CELL1 are coupled by a bonding method.

In various example embodiments, an input/output contact plug may be disposed to overlap or at least partially overlap the third substrate 410. For example, as illustrated in C1-C3, the second input/output contact plug 403 may be formed through the interlayer insulating layer 415 of the second cell region CELL2 in the third direction (the Z-axis direction) and may be electrically connected to the second input/output pad 405 through the third substrate 410. In this case, a connection structure of the second input/output contact plug 403 and the second input/output pad 405 may be implemented in various ways.

For example, as illustrated in C1, an opening 408 may be formed through the third substrate 410, and the second input/output contact plug 403 may be directly connected to the second input/output pad 405 through the opening 408 formed in the third substrate 410. In this case, as illustrated in C1, the second input/output contact plug 403 may have an increasing diameter toward the second input/output pad 405. However, this is illustrative, and the second input/output contact plug 403 may have a decreasing diameter toward the second input/output pad 405.

For example, as illustrated in C2, the opening 408 may be formed through the third substrate 410, and a contact 407 may be formed in the opening 408. One end portion of the contact 407 may be connected to the second input/output pad 405, and an opposite end portion of the contact 407 may be connected to the second input/output contact plug 403. Accordingly, the second input/output contact plug 403 may be electrically connected to the second input/output pad 405 through the contact 407 in the opening 408. In this case, as illustrated in C2, the contact 407 may have an increasing diameter toward the second input/output pad 405, and the second input/output contact plug 403 may have a decreasing diameter toward the second input/output pad 405. For example, the third input/output contact plug 403 may be formed together with the cell contact plugs 440 before the second cell region CELL2 and the first cell region CELL1 are coupled by a bonding method, and the contact 407 may be formed after the second cell region CELL2 and the first cell region CELL1 are coupled by the bonding method.

For example, as illustrated in C3, a stopper 409 may be additionally formed on an upper surface of the opening 408 of the third substrate 410. The stopper 409 may be or may include a metal line formed on the same layer as the common source line 420. However, this is illustrative, and the stopper 409 may be or may include a metal line formed on the same layer as at least one of the word lines 430. The second input/output contact plug 403 may be electrically connected to the second input/output pad 405 through the contact 407 and the stopper 409.

Meanwhile, similarly to the second and third input/output contact plugs 403 and 404 of the second cell region CELL2, the second and third input/output contact plugs 303 and 304 of the first cell region CELL1 may have a decreasing diameter or decreasing tapering toward the lower metal pattern 371*e*, or may have an increasing diameter or increasing tapering toward the lower metal pattern 371*e*.

Meanwhile, in some example embodiments, a slit 411 may be formed in the third substrate 410. For example, the slit 411 may be formed at any position in the external pad bonding region PA. For example, as illustrated in D, the slit 411 may be located between the second input/output pad 405 and the cell contact plugs 440 when viewed on the plane.

However, this is illustrative, and the slit 411 may be formed such that the second input/output pad 405 is located between the slit 411 and the cell contact plugs 440 when viewed on the plane.

For example, as illustrated in D1, the slit 411 may be formed through the third substrate 410. For example, the slit 411 may be used to prevent the third substrate 410 from being finely cracked when the opening 408 is formed. However, this is illustrative, and the slit 411 may be formed to have a depth ranging from about 60% to about 70% of the thickness of the third substrate 410.

For example, as illustrated in D2, a conductive material 412 may be formed in the slit 411. For example, the conductive material 412 may be used to discharge a leakage current generated while circuit elements in the external pad bonding region PA are driven. In this case, the conductive material 412 may be connected to an external ground line.

For example, as illustrated in D3, an insulating material 413 may be formed in the slit 411. For example, the insulating material 413 may be formed to electrically isolate the second input/output pad 405 and the second input/output contact plug 403 disposed in the external pad bonding region PA from the word line bonding region WLBA. An influence of a voltage provided through the second input/output pad 405 on a metal layer disposed on the third substrate 410 in the word line bonding region WLBA may be interrupted by forming the insulating material 413 in the slit 411.

Meanwhile, in some embodiments, the first to third input/output pads 105, 405, and 406 may be selectively formed. For example, the memory device 1000_1 may be implemented to include only the first input/output pad 105 disposed on the first substrate 201, only the second input/output pad 405 disposed on the third substrate 401, or only the third input/output pad 406 disposed on the upper insulating layer 401.

Meanwhile, in some embodiments, at least one of the second substrate 310 of the first cell region CELL1 or the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the peripheral circuit region PERI and the first cell region CELL1 are bonded to each other, and an insulating layer for covering an upper surface of the common source line 320 or a conductive layer for connection may be formed. Similarly, the third substrate 410 of the second cell region CELL2 may be removed before or after the first cell region CELL1 and the second cell region CELL2 are bonded to each other, and the upper insulating layer 401 for covering an upper surface of the common source line 420 or a conductive layer for connection may be formed.

As described above, the memory device 1000_1 according to various example embodiments may be formed in a C2C structure. In particular, the lower chip constituting the peripheral circuit region PERI may include the first sub-peripheral circuit region Sub PERI1 and the second sub-peripheral circuit region Sub PERI2 stacked in the third direction (the Z-axis direction). In this case, the first sub-peripheral circuit region Sub PERI1 may include the plurality of circuit elements 120*a*, 120*b*, and 120*c* formed on the first substrate 110, the second sub-peripheral circuit region Sub PERI2 may include the plurality of circuit elements 220*a*, 220*b*, and 220*c* formed on the sub-poly structure 210, and a part of the plurality of circuit elements 120*a*, 120*b*, and 120*c* and a part of the plurality of circuit elements 220*a*, 220*b*, and 220*c* may be electrically connected to each other.

An area on the plane that is required or used to form the peripheral circuit region PERI of the lower chip may be decreased by forming the lower chip in such a way as to stack the sub-peripheral circuit regions in the third direction (the Z-axis direction).

In more detail, in a case of a lower chip formed of a single layer, an area on a plane that is required or used to implement necessary or desired circuit elements is generally larger than that of an upper chip. In a case in which a memory device is implemented in a C2C structure, the size of the upper chip on the plane is inevitably increased to correspond to the lower chip, which is an impediment to compactness of the memory device. Furthermore, in this case, the percentage of an external pad bonding region in which a memory cell is not disposed in the upper chip is increased, and therefore the space in the memory device may be inefficiently used.

In contrast, the lower chip according to the embodiment of example embodiments includes the sub-peripheral circuit regions vertically stacked in the third direction. Accordingly, the size of the lower chip on the plane may coincide with the size of the upper chip on the plane. In addition, even though the area of the upper chip on the plane is decreased as the number of stages of the word lines is increased, the size of the lower chip on the plane may coincide with the size of the upper chip on the plane by increasing the number of vertically stacked sub-peripheral circuit regions. Thus, the size of the lower chip on the plane may be reduced in accordance with the decrease in the size of the upper chip on the plane. Accordingly, the memory device 1000_1 having the C2C structure may be made compact, and a waste of space in the external pad bonding region PA may be reduced or minimized.

Hereinafter, various example embodiments of the memory device having the C2C structure will be described in more detail.

Figure 4:
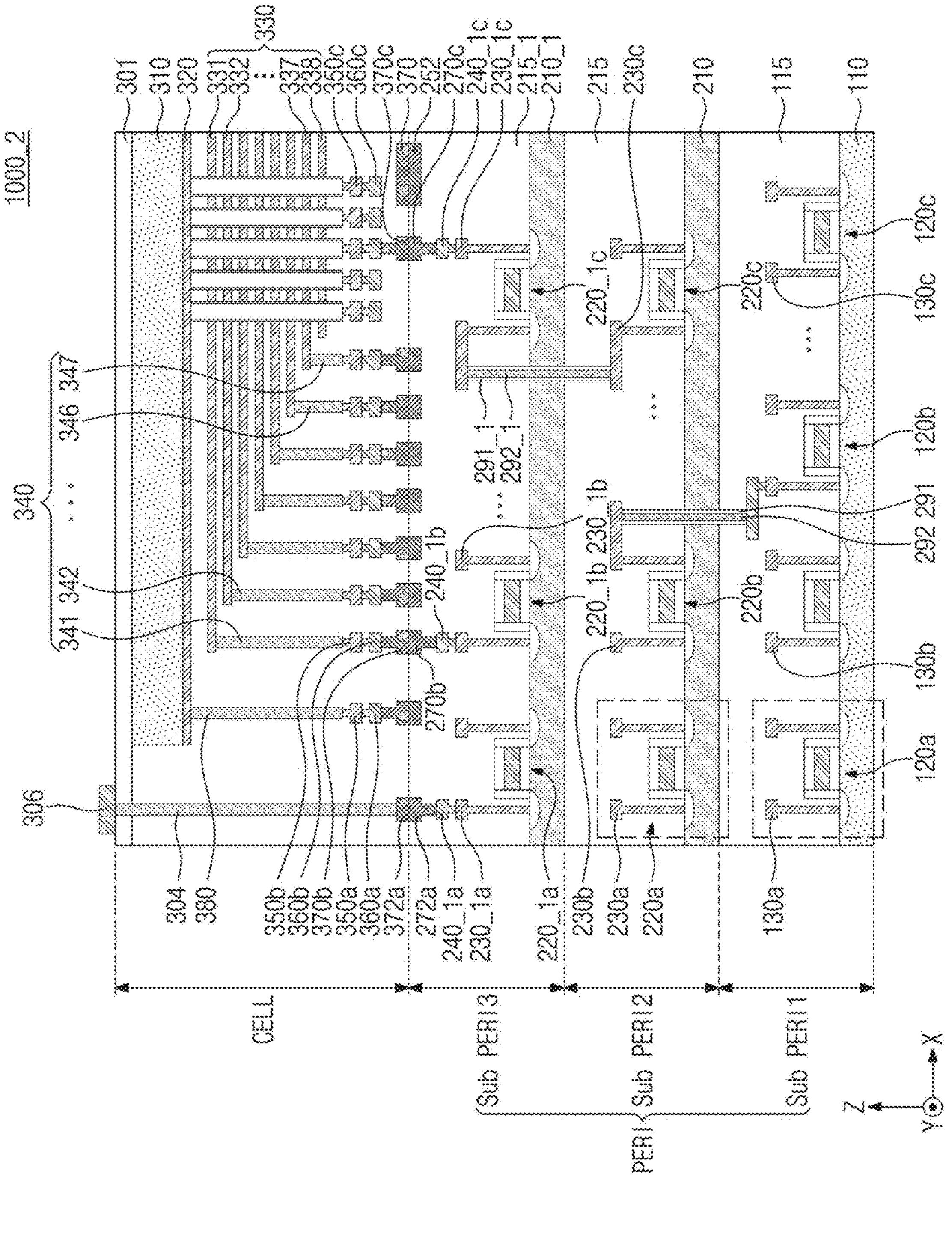
FIG. 4 is a sectional view illustrating one example of a memory device according to various example embodiments.
Figure 5A:
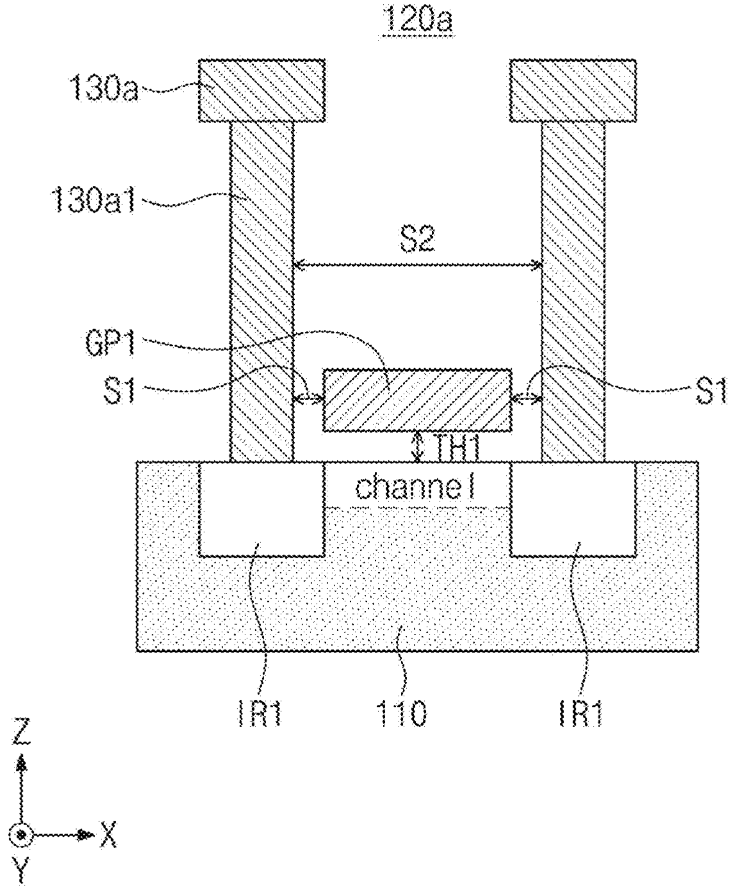
FIG. 5A is a view illustrating one example of a low-voltage transistor in a first sub-peripheral circuit region.
Figure 5B:
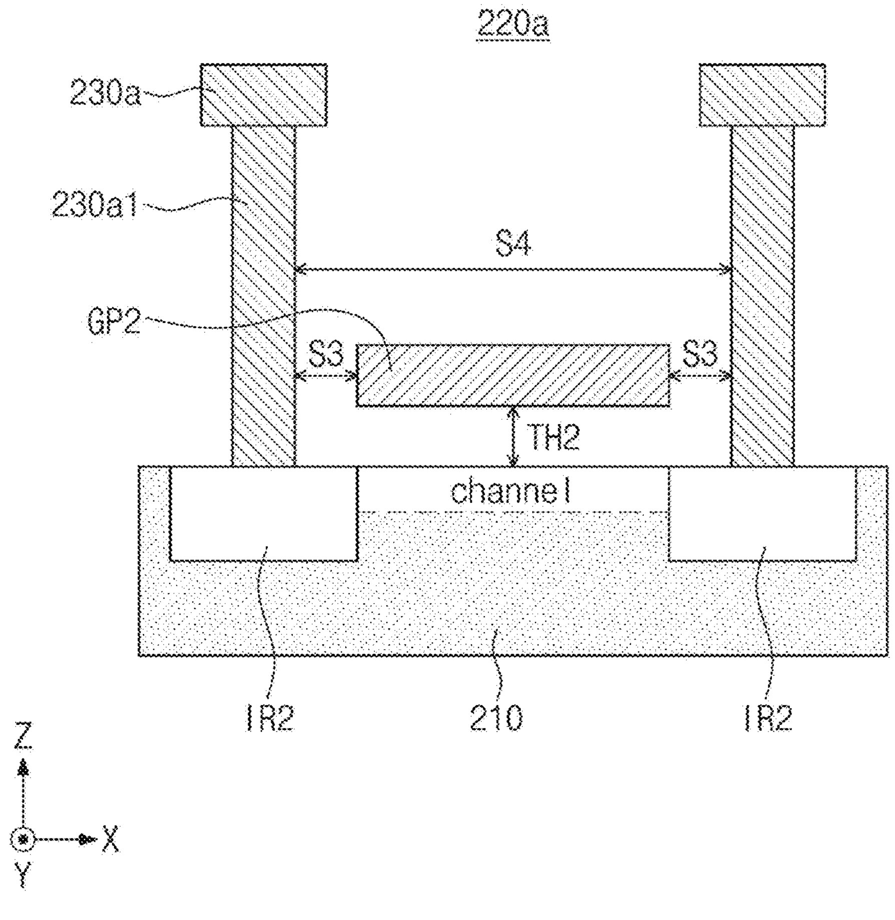
FIG. 5B is a view illustrating one example of a high-voltage transistor in a second sub-peripheral circuit region.

FIG. 4 is a sectional view illustrating one example of a memory device 1000_2 according to various example embodiments. FIG. 5A is a view illustrating one example of a low-voltage transistor in a first sub-peripheral circuit region Sub PERI1, and FIG. 5B is a view illustrating one example of a high-voltage transistor in a second sub-peripheral circuit region Sub PERI2. A low-voltage transistor may have a threshold voltage lower (e.g., lower in absolute value) than a high-voltage transistor.

For convenience of description, it is assumed that the memory device 1000_2 of FIG. 4 has a C2C structure in which one upper chip and one lower chip are coupled by a bonding method and the lower chip includes three sub-peripheral circuit regions. The memory device 1000_2 of FIG. 4 is similar to the memory device 1000_1 of FIG. 3. Accordingly, identical or similar components will be assigned with identical or similar reference numerals, and repetitive descriptions will hereinafter be omitted for brevity of description.

Referring to FIG. 4, the memory device 10002 may have the C2C structure in which the upper chip including a cell region CELL and the lower chip including the peripheral circuit region PERI are connected by the bonding method. The peripheral circuit region PERI of the lower chip may include first to third sub-peripheral circuit regions Sub PERI1 to Sub PERI3 stacked in the third direction (the Z-axis direction).

The first sub-peripheral circuit region Sub PERI1 may include a first substrate 110 and a plurality of circuit elements 120*a*, 120*b*, and 120*c* formed on the first substrate 110. The first substrate 110 may be a semiconductor substrate having a plate shape expanded along a plane defined by the first and second directions (the X-axis direction and the Y-axis direction). For example, the first substrate 110 may be a bulk silicon substrate or a silicon-on-insulator substrate.

The second sub-peripheral circuit region Sub PERI2 may include a first sub-poly structure 210 and a plurality of circuit elements 220*a*, 220*b*, and 220*c* formed on the first sub-poly structure 210. The first sub-poly structure 210 may include a material different from that of the first substrate 110. For example, the first substrate 110 may be a bulk silicon substrate, and the first sub-poly structure 210 may be doped poly-silicon or an epitaxial thin film.

A part of the circuit elements of the first sub-peripheral circuit region Sub PERI1 and a part of the circuit elements of the second sub-peripheral circuit region Sub PERI2 may be electrically connected. For example, the circuit element 120*b* of the first sub-peripheral circuit region Sub PERI1 and the circuit element 220*b* of the second sub-peripheral circuit region Sub PERI2 may be connected by a through-electrode 292. The through-electrode 292 may penetrate the first sub-poly structure 210. An upper surface of the through-electrode 292 may be in contact with one of first metal lines 230*a*, 230*b*, and 230*c* of the second sub-peripheral circuit region Sub PERI2. A lower surface of the through-electrode 292 may be in contact with one of first metal lines 130*a*, 130*b*, and 130*c* of the first sub-peripheral circuit region Sub PERI1. All or part of a side surface of the through-electrode 292 may be surrounded by a through-electrode insulating layer 292.

Similarly, the third sub-peripheral circuit region Sub PERI3 may include a second sub-poly structure 210_1 and a plurality of circuit elements 220_1*a*, 220_1*b*, and 220_1*c* formed on the second sub-poly structure 2101, and the circuit elements of the third sub-peripheral circuit region Sub PERI3 and the circuit elements of the second sub-peripheral circuit region Sub PERI2 may be connected by a through-electrode 292_1. Accordingly, the first sub-peripheral circuit region Sub PERI1 may be electrically connected to the third sub-peripheral circuit region Sub PERI3 through the through-electrodes 292 and 292_1 and may be electrically connected to the cell region CELL through the third sub-peripheral circuit region Sub PERI3.

Continuously referring to FIG. 4, the circuit elements of the first sub-peripheral circuit region Sub PERI1 may be low-voltage transistors. Alternatively, the number of low-voltage transistors of the first sub-peripheral circuit region Sub PERI1 may be larger than the number of high-voltage transistors. The circuit elements of the second and third sub-peripheral circuit regions Sub PERI2 and Sub PERI3 may be high-voltage transistors. Alternatively, the number of high-voltage transistors of the second and third sub-peripheral circuit regions Sub PERI2 and Sub PERI3 may be larger than the number of low-voltage transistors.

For example, referring to FIG. 5A, the circuit element 120*a* of the first sub-peripheral circuit region Sub PERI1 may be a low-voltage transistor. The circuit element 120*a* may include the first substrate 110, first impurity regions IR1, a first gate pattern GP1, metal contacts 130*a*1, and the metal lines 130*a*. The first impurity regions IR1 may be defined in the first substrate 110. For example, the first impurity regions IR1 may be defined in a well region WELL of the first substrate 110.

For example, referring to FIG. 5B, the circuit element 220*a* of the second sub-peripheral circuit region Sub PERI2 may be a high-voltage transistor. The circuit element 220*a* may include the first sub-poly structure 210, second impurity regions IR2, a second gate pattern GP2, metal contacts 230*a*1, and the metal lines 230*a*. The second impurity regions IR2 may be defined in the first sub-poly structure 210. For example, the second impurity regions IR2 may be defined in an N-doped region of the first sub-poly structure 210.

Referring to FIGS. 5A and 5B, the circuit element 120*a*, which is a low-voltage transistor, may be formed to be smaller than the circuit element 220*a*, which is a high-voltage transistor. For example, first gaps S1 between the first gate pattern GP1 and the metal contacts 130*a*1 of the circuit element 120*a*, which is a low-voltage transistor, in the first direction (the X-axis direction) may be smaller than third gaps S3 between the second gate pattern GP2 and the metal contacts 230*a*1 of the circuit element 220*a*, which is a high-voltage transistor. Alternatively, a second gap S2 between the metal contacts 130*a*1 of the circuit element 120*a*, which is a low-voltage transistor, in the first direction (the X-axis direction) may be smaller than a fourth gap S4 between the metal contacts 230*a*1 of the circuit element 220*a*, which is a high-voltage transistor. In another case, a first thickness TH1 between the first gate pattern GP1 and a channel of the circuit element 120*a*, which is a low-voltage transistor, in the third direction (the Z-axis direction) may be smaller than a second thickness TH2 between the second gate pattern GP2 and a channel of the circuit element 220*a*, which is a high-voltage transistor. Accordingly, the number of transistors disposed in the first sub-peripheral circuit region Sub PERI1 may be larger than the number of transistors disposed in the second or third sub-peripheral circuit region Sub PERI2 or Sub PERI3.

Meanwhile, in FIG. 4, a common source line 320 is illustrated as a metal line. However, this is illustrative, and the common source line 320 may be formed of the same material as the first or second sub-poly structure 210 or 210_1. For example, the common source line 320 may be doped poly-silicon.

Furthermore, in FIG. 4, the upper chip is illustrated as including a second substrate 310. However, this is illustrative, and the second substrate 310 may be used as a sacrificial substrate. That is, the upper chip may not include the second substrate 310. In this case, an upper insulating layer 301 may be formed on the common source line 320.

Figure 6:
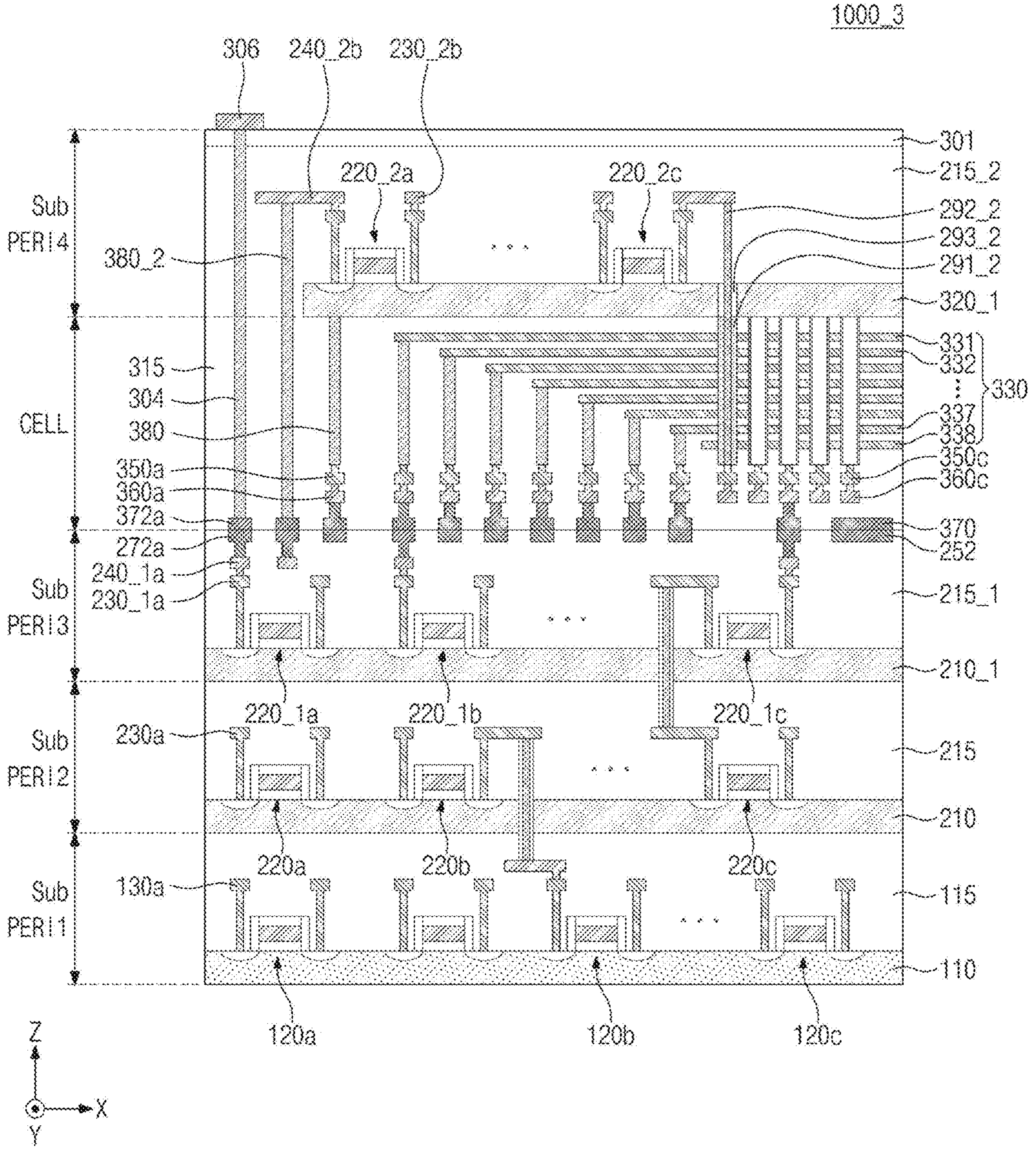
FIG. 6 is a sectional view illustrating one example of a memory device according to various example embodiments.

FIG. 6 is a sectional view illustrating one example of a memory device 1000_3 according to various example embodiments. For convenience of description, it is assumed that likewise to the memory device 1000_2 of FIG. 4, the memory device 1000_3 of FIG. 6 has a C2C structure in which one upper chip and one lower chip are coupled by a bonding method. Accordingly, identical or similar components will be assigned with identical or similar reference numerals, and repetitive descriptions will hereinafter be omitted for brevity of description.

Unlike the memory device 1000_2 of FIG. 4, the memory device 1000_3 of FIG. 6 may further include a fourth sub-peripheral circuit region Sub PERI4 formed in the upper chip. That is, based on a third sub-poly structure 320_1 of the upper chip, a cell region CELL may be formed on an upper side of the upper chip, and the fourth sub-peripheral circuit region Sub PERI4 may be formed on a lower side of the upper chip.

The third sub-poly structure 320_1 of the upper chip may have a plate shape expanded along a plane defined by the first and second directions (the X-axis direction and the Y-axis direction). The third sub-poly structure 320_1 may include poly-silicon or a conductive material. For example, the third sub-poly structure 320_1 may include doped poly-silicon. The third sub-poly structure 320_1 may be used as a common source line connected to memory cells of the cell region CELL.

The fourth sub-peripheral circuit region Sub PERI4 may include circuit elements 220_2*a* to 220_2*c*. The circuit elements 220_2*a* to 220_2*c* of the fourth sub-peripheral circuit region Sub PERI4 may be electrically connected to the cell region CELL or another sub-peripheral circuit region.

For example, the circuit element 220_2c of the fourth sub-peripheral circuit region Sub PERI4 may be in contact with a second metal line 240_2b, and the second metal line 240_2b may be in contact with a through-contact plug 2922. The through-contact plug 2922 may extend in the third direction (the Z-axis direction) to penetrate the third sub-poly structure 302_1 and word lines 330 and may be in contact with a first metal line 350c of the cell region CELL. Furthermore, the through-contact plug 2922 may be electrically insulated from the third sub-poly structure 3201 by a buried insulating layer 2932 in the third sub-poly structure 320_1. In addition, the through-contact plug 292_2 may be electrically insulated from the word lines 330 by a contact insulating layer 2912. The contact insulating layer 2912 may penetrate the word lines 330 in the third direction (the Z-axis direction) and may surround the through-contact plug 2922.

In another example, the circuit element 220_2a of the fourth sub-peripheral circuit region Sub PERI4 may be in contact with the second metal line 240_2b, and the second metal line 240_2b may be in contact with a contact plug 380_2. That is, the circuit element 220_2a of the fourth sub-peripheral circuit region Sub PERI4 may be electrically connected to a third sub-peripheral circuit region Sub PERI3 through the contact plug 380_2 formed on one side of the third sub-poly structure 320_1.

Figure 7:
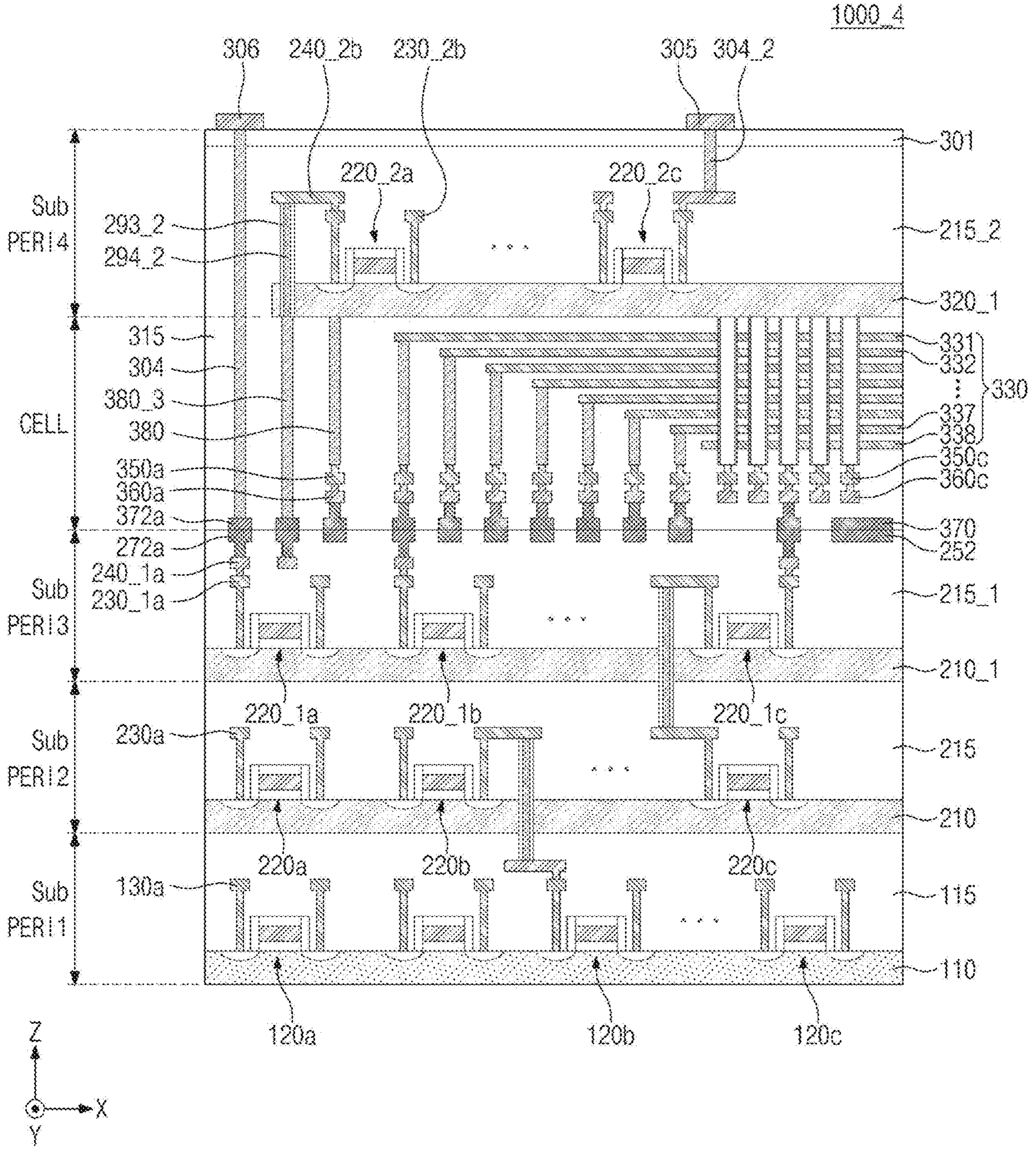
FIG. 7 is a sectional view illustrating one example of a memory device according to various example embodiments.

FIG. 7 is a sectional view illustrating one example of a memory device 1000_4 according to various example embodiments. For convenience of description, it is assumed that similarly to the memory device 1000_3 of FIG. 6, the memory device 1000_4 of FIG. 7 has a C2C structure in which one upper chip and one lower chip are coupled by a bonding method and the upper chip includes a cell region CELL and a fourth sub-peripheral circuit region Sub PERI4. Accordingly, identical or similar components will be assigned with identical or similar reference numerals, and repetitive descriptions will hereinafter be omitted for brevity of description.

Referring to FIG. 7, the fourth sub-peripheral circuit region Sub PERI4 of the upper chip may include circuit elements 220_2a to 220_2c, and the circuit elements 220_2a to 220_2c may be electrically connected to an input/output pad or another sub-peripheral circuit region.

For example, the circuit element 220_2c of the fourth sub-peripheral circuit region Sub PERI4 may be in contact with a second metal line 240_2b, and the second metal line 240_2b may be in contact with an input/output contact plug 304_2. The input/output contact plug 304_2 may extend in the third direction (the Z-axis direction), may penetrate an upper insulating layer 301, and may be connected to an input/output pad 305.

In another example, the circuit element 220_2a of the fourth sub-peripheral circuit region Sub PERI4 may be in contact with the second metal line 240_2b, and the second metal line 240_2b may be in contact with a through-electrode 294_2. The through-electrode 294_2 may extend in the third direction (the Z-axis direction), may penetrate a third sub-poly structure 3201, and may be connected to a contact plug 3803. The contact plug 3803 may penetrate an interlayer insulating layer 315 of the cell region CELL in the third direction (the Z-axis direction) and may be connected to a third sub-peripheral circuit region Sub PERI3. That is, the circuit element 220_2a of the fourth sub-peripheral circuit region Sub PERI4 may be electrically connected to the third sub-peripheral circuit region Sub PERI3 through the through-electrode 2942 penetrating the third sub-poly structure 320_1 and the contact plug 3803 penetrating the interlayer insulating layer 315 of the cell region CELL. In this case, the through-electrode 294_2 may be surrounded by a through-electrode insulating layer 293_2.

As described above, the memory devices 1000_3 and 1000_4 according to the embodiments of the present disclosure may be implemented such that not only the lower chip but also the upper chip includes a sub-peripheral circuit region. Accordingly, various wiring structures may be implemented depending on functions of circuit elements of various peripheral circuit regions PERI.

Meanwhile, it is illustrated that the upper chips of the memory devices 1000_3 and 1000_4 of FIGS. 6 and 7 do not include a substrate. That is, a substrate is used as a sacrificial substrate and removed in a process of manufacturing the upper chip. However, this is illustrative, and the upper chips of the memory devices 1000_3 and 1000_4 may be implemented to include a substrate. For example, the substrate may be located adjacent to an upper surface of the upper insulating layer 301.

Figure 8:
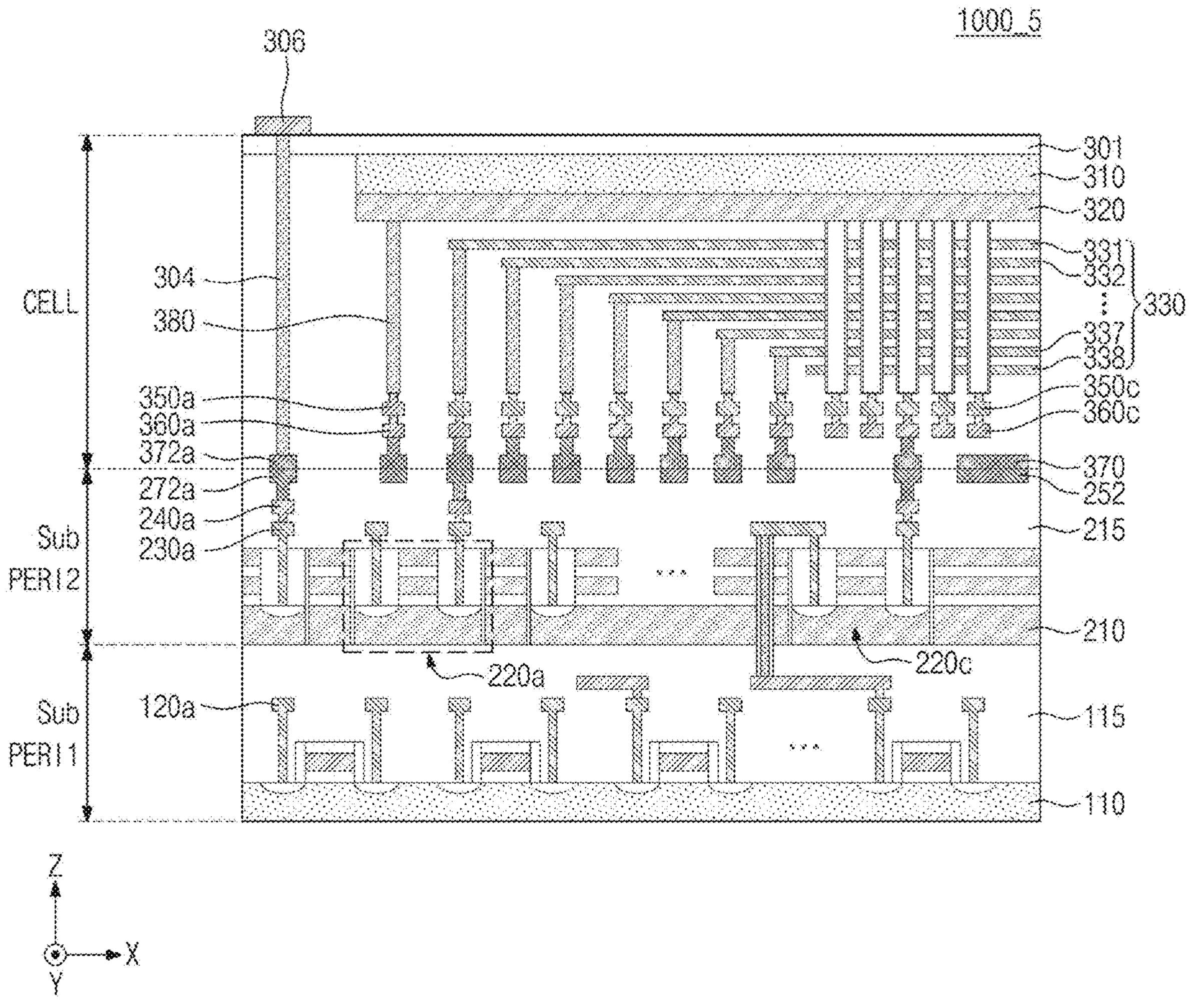
FIG. 8 is a sectional view illustrating one example of a memory device according to various example embodiments.
Figure 9:
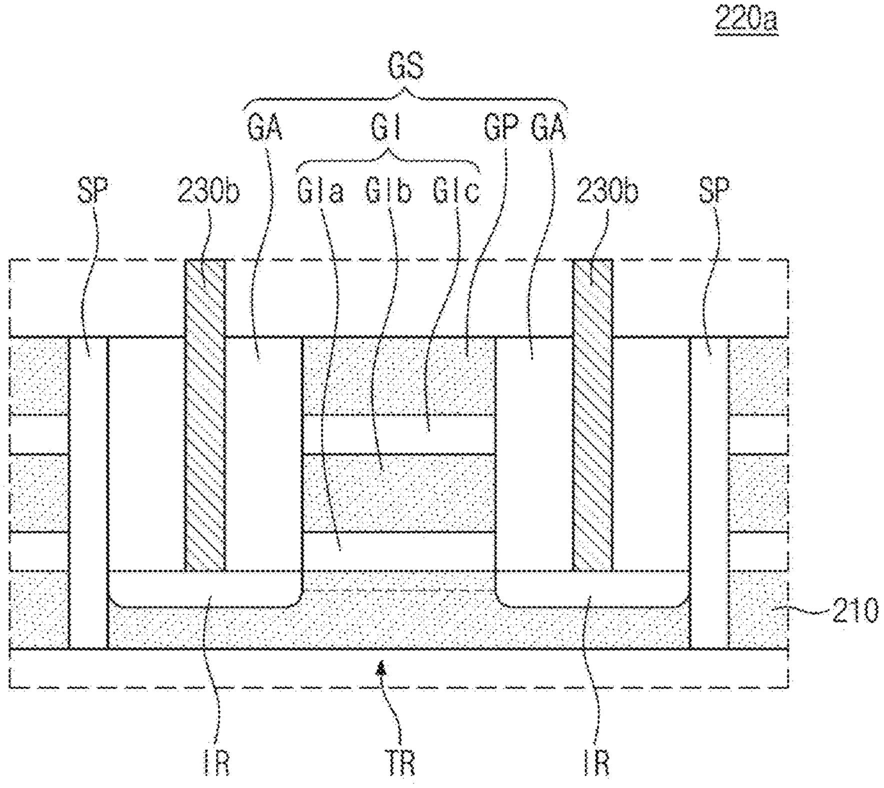
FIG. 9 is a view illustrating one example of a transistor in a second sub-peripheral circuit region.

FIG. 8 is a sectional view illustrating one example of a memory device 1000_5 according to various example embodiments. FIG. 9 is a view illustrating one example of a transistor in a second sub-peripheral circuit region Sub PERI2.

For convenience of description, it is assumed that the memory device 1000_5 of FIG. 8 has a C2C structure in which one upper chip and one lower chip are coupled by a bonding method and the lower chip includes two sub-peripheral circuit regions. The memory device 1000_5 of FIG. 8 is similar to the memory device 1000_2 of FIG. 4. Accordingly, identical or similar components will be assigned with identical or similar reference numerals, and repetitive descriptions will hereinafter be omitted for brevity of description.

Referring to FIG. 8, circuit elements 220a to 220c of the second sub-peripheral circuit region Sub PERI2 may be provided between a sub-poly structure 210 and an interlayer insulating layer 215. Gate patterns of the circuit elements 220a to 220c of the second sub-peripheral circuit region Sub PERI2 may be formed of the same material as the sub-poly structure 210.

In more detail, referring to FIG. 9, the circuit element 220a may include impurity regions IR, a gate structure GS, and metal contacts 230b.

The impurity regions IR may be defined in the sub-poly structure 210. For example, the impurity regions IR may be formed by doping the sub-poly structure 210 with impurities.

The gate structure GS may include a gate pattern GP, a gate insulating layer GI, and gate spacers GA. The gate insulating layer GI may be disposed between the gate pattern GP and the sub-poly structure 210. The gate pattern GP may be electrically isolated from the sub-poly structure 210 by the gate insulating layer GI. An upper surface of the gate pattern GP may be covered by the interlayer insulating layer 215. The gate spacers GA may be disposed on opposite sides of the gate insulating layer GI and the gate pattern GP.

The gate pattern GP may be formed of the same material as the sub-poly structure 210. For example, the gate pattern GP may include doped poly-silicon.

The gate spacers GA may include an insulating material. For example, the gate spacers GA may include oxide.

The gate insulating layer GI may include a first intervening portion GIa, a second intervening portion GIb, and a third intervening portion GIc. The first intervening portion GIa, the second intervening portion GIb, and the third intervening portion GIc may be sequentially stacked in the third direction (the Z-axis direction). The first intervening portion GIa may be disposed on the sub-poly structure 210, the second intervening portion GIb may be disposed on the first intervening portion GIa, and the third intervening portion GIc may be disposed on the second intervening portion GIb.

The first intervening portion GIa and the third intervening portion GIc may include the same material as the gate spacers GA. For example, the first intervening portion GIa and the third intervening portion GIc may include an insulating material such as oxide. The second intervening portion GIb may include the same material as the sub-poly structure 210. For example, the second intervening portion GIb may include doped silicon.

Meanwhile, spacers SP may be disposed on opposite sides of the circuit element 220*a*, and the circuit element 220*a* may be electrically insulated from other adjacent circuit elements by the spacers SP.

As described above, the sub-poly structures 210 and the gate patterns of the circuit elements 220*a* to 220*c* of the second sub-peripheral circuit region Sub PERI2 of the lower chip may be implemented to include the same material.

Meanwhile, it has been described in FIGS. 3 to 9 that the circuit elements formed on the sub-poly structure are high-voltage transistors. However, this is illustrative, and as will be described below, a memory device according to various example embodiments may include low-voltage transistors formed on a sub-poly structure.

Figure 10:
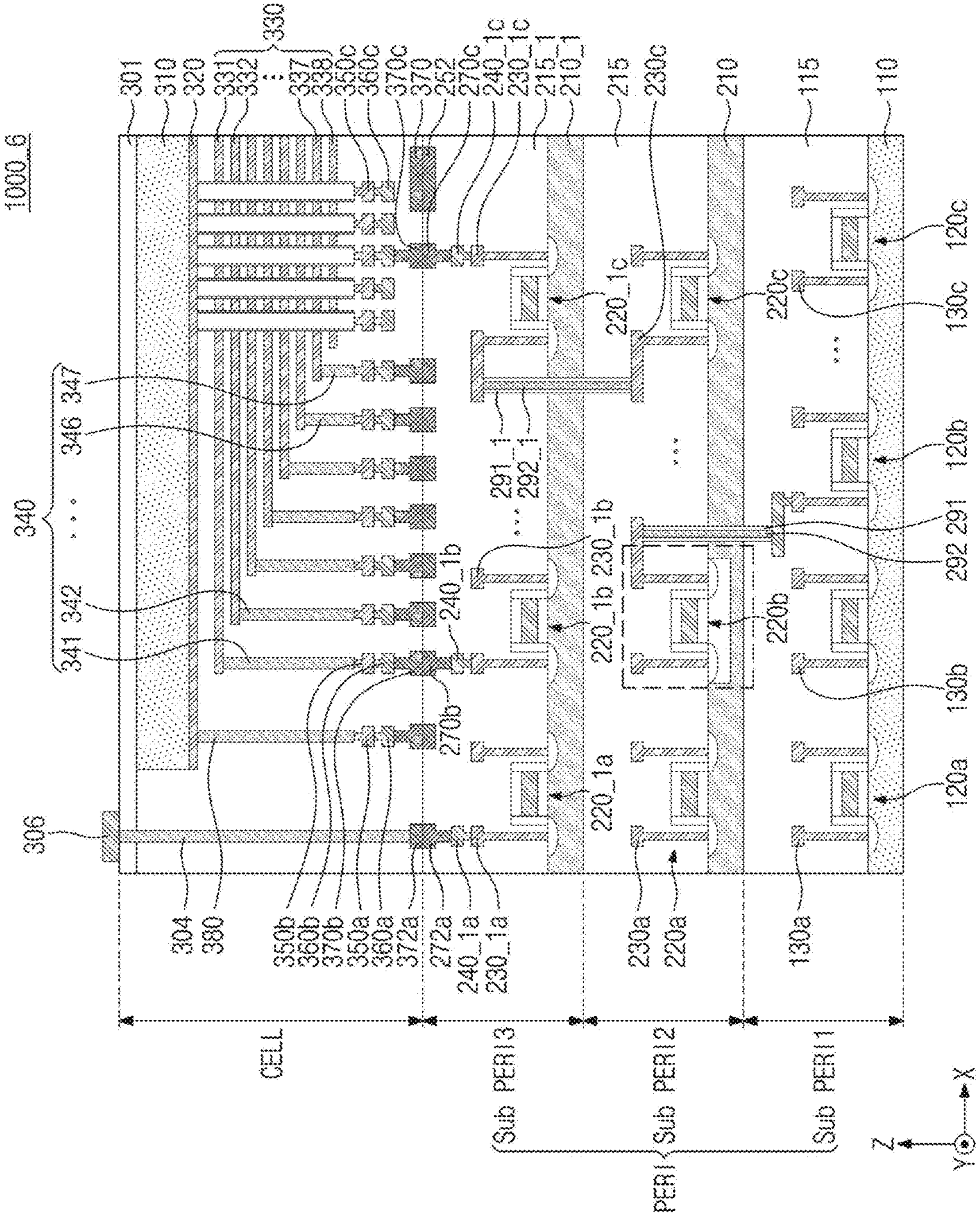
FIG. 10 is a sectional view illustrating one example of a memory device according to various example embodiments.
Figure 11:
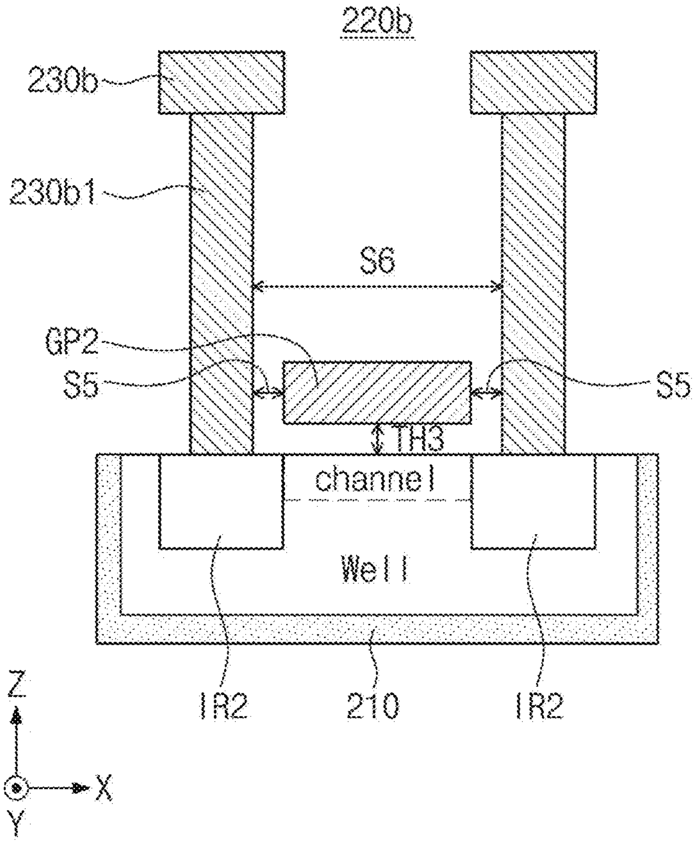
FIG. 11 is a view illustrating one example of a high-voltage transistor in a second sub-peripheral circuit region.

FIG. 10 is a sectional view illustrating one example of a memory device 1000_6 according to various example embodiments. FIG. 11 is a view illustrating one example of a low-voltage transistor in a second sub-peripheral circuit region Sub PERI2. The memory device 1000_6 of FIG. 10 and the low-voltage transistor of FIG. 11 are similar to the memory device 1000_2 of FIG. 4 and the low-voltage transistor of FIG. 5A. Accordingly, identical or similar components will be assigned with identical or similar reference numerals, and repetitive descriptions will hereinafter be omitted for brevity of description.

Unlike in the memory device 1000_2 of FIG. 4 in which the circuit elements of the second sub-peripheral circuit region Sub PERI2 are implemented as the high-voltage transistors, circuit elements of the second sub-peripheral circuit region Sub PERI2 of the memory device 1000_6 of FIG. 10 may be implemented as low-voltage transistors. To this end, a well region WELL may be separately defined in a sub-poly structure 210.

In more detail, referring to FIG. 11, a circuit element 220*b* of the second sub-peripheral circuit region Sub PERI2 may be a low-voltage transistor. The circuit element 220*b* may include the sub-poly structure 210, second impurity regions IR2, a second gate pattern GP2, metal contacts 230*b*1, and metal lines 230*b*. The second impurity regions IR2 may be defined in the well region WELL of the sub-poly structure 210. For example, the second impurity regions IR2 may be defined as an N+ doped region in the well region WELL of the sub-poly structure 210.

In this case, the circuit element 220*b* formed on the sub-poly structure 210 may have a size that is the same as, or similar to, the size of the circuit element 120*a* (refer to FIG. 5A) formed on the first substrate 110. For example, fifth gaps S5 and a sixth gap S6 of the circuit element 220*b* formed on the sub-poly structure 210 may be the same as, or similar to, the first gaps S1 and the second gap S2 of the circuit element 120*a* formed on the first substrate 110.

As described above, the low-voltage transistor may be formed on the sub-poly structure 210 by forming the well region WELL in the sub-poly structure 210 and doping the well region WELL with impurities.

Meanwhile, it has been described in FIGS. 3 to 11 that the peripheral circuit region of the stacked structure is applied to the C2C structure in which the upper chip and the lower chip are connected to each other by the bonding method. However, this is illustrative, and as will be described below, the present disclosure may be applied to a chip having a chip on peri (COP) structure.

Figure 12:
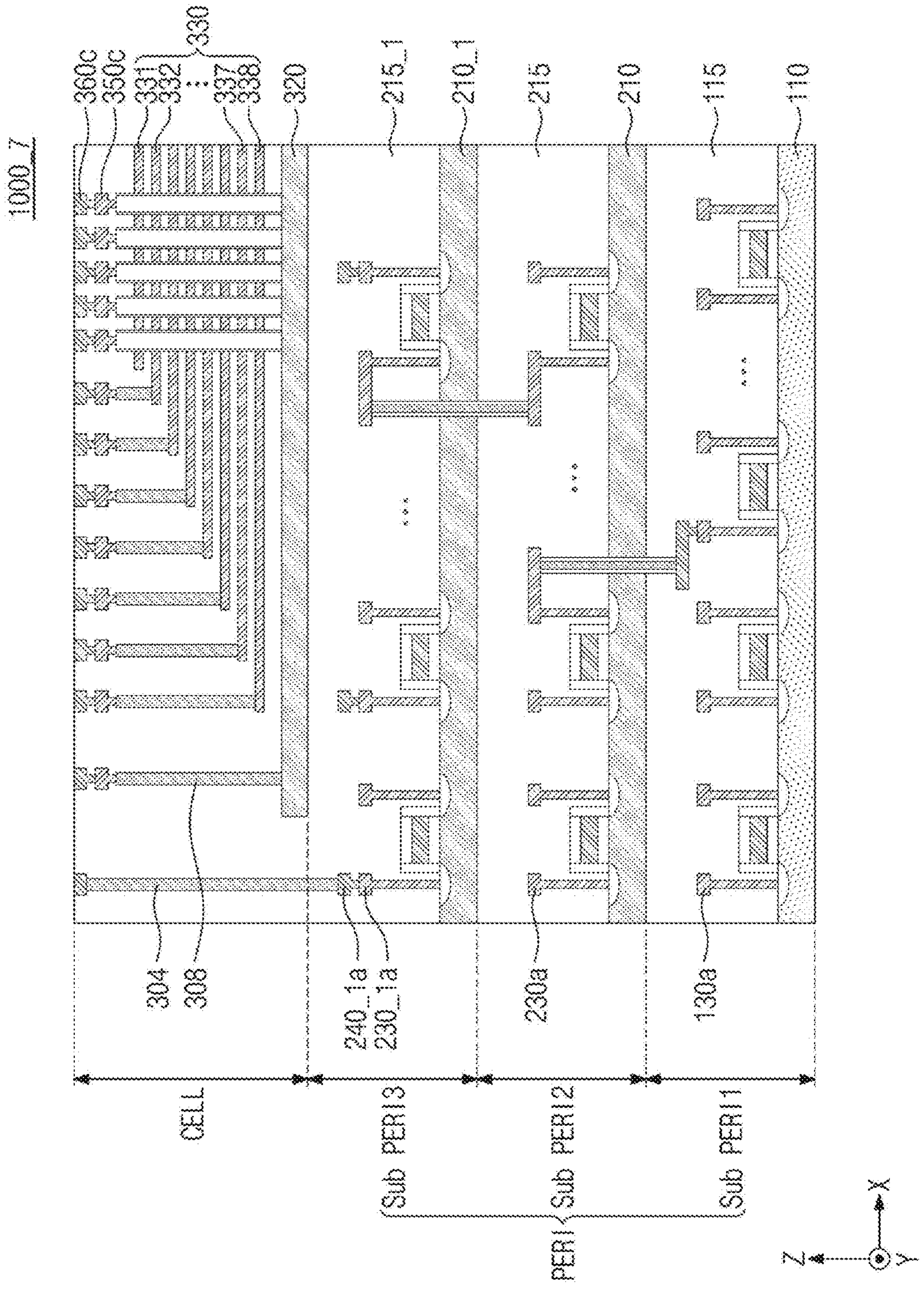
FIG. 12 is a sectional view illustrating one example of a memory device according to various example embodiments.

FIG. 12 is a sectional view illustrating one example of a memory device 1000_7 according to various example embodiments. The memory device 1000_7 of FIG. 12 is similar to the memory device 1000_2 of FIG. 4. Accordingly, identical or similar components will be assigned with identical or similar reference numerals, and repetitive descriptions will hereinafter be omitted for brevity of description.

Unlike the memory device 1000_2 of FIG. 4, the memory device 1000_7 of FIG. 12 may be formed by a COP method. For example, a first sub-peripheral circuit region Sub PERI1, a second sub-peripheral circuit region Sub PERI2, a third sub-peripheral circuit region Sub PERI3, and a cell region CELL may be sequentially stacked on a substrate 110. That is, unlike in the memory device 1000_2 of FIG. 4 in which the upper chip and the lower chip are separately manufactured and then coupled by the bonding method, a peripheral circuit region PERI and the cell region CELL may be sequentially formed on the one substrate 110 in the memory device 1000_7 of FIG. 12.

In this case, circuit elements of the sequentially stacked first to third sub-peripheral circuit regions Sub PERI1 to Sub PERI3 may be electrically connected to each other by the above-described through-electrode. Furthermore, the circuit elements of the first sub-peripheral circuit region Sub PERI1 may be low-voltage transistors, or the number of low-voltage transistors of the first sub-peripheral circuit region Sub PERI1 may be larger than the number of high-voltage transistors.

In addition, the circuit elements of the second and third sub-peripheral circuit regions Sub PERI2 and Sub PERI3 may be high-voltage transistors, or the number of high-voltage transistors of the second and third sub-peripheral circuit regions Sub PERI2 and Sub PERI3 may be larger than the number of low-voltage transistors.

Alternatively, the circuit elements of the second and third sub-peripheral circuit regions Sub PERI2 and Sub PERI3 may be low-voltage transistors, or the number of low-voltage transistors of the second and third sub-peripheral circuit regions Sub PERI2 and Sub PERI3 may be larger than the number of high-voltage transistors. In this case, well regions WELL may be defined in sub-poly structures of the second and third sub-peripheral circuit regions Sub PERI2 and Sub PERI3, and impurity regions may be formed in the well regions.

As described above, even in the memory device having the COP structure, a chip may be formed by stacking the sub-peripheral circuit regions in the third direction (the Z-axis direction). Accordingly, an area on a plane that is required or desired to form the peripheral circuit region PERI may be decreased. In addition, in a case in which the area of the cell region on the plane is decreased due to an increase in the number of stages of word lines, the area of the peripheral circuit region on the plane may coincide with the area of the cell region by increasing the number of vertically stacked sub-peripheral circuit regions.

The memory device according to example embodiments includes the plurality of vertically stacked sub-peripheral circuit regions. Accordingly, the area occupied by the peripheral circuit region when viewed on the plane may be decreased.

The above-described contents are specific embodiments for carrying out various features. Inventive concepts not only the above-described example embodiments but also various embodiments that can be made through a simple design change or can be easily modified. Furthermore, inventive concepts includes technologies that can be carried out by easily modifying example embodiments. Accordingly, the scope should not be determined by the above-described example embodiments and should be determined by the accompanying claims and the equivalents thereof. Additionally, example embodiments are not necessarily mutually exclusive. For example, some example embodiments may include one or more features described with reference to one or more figures, and may also include one or more other features described with reference to one or more other figures.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While inventive concepts have been described with reference to various example embodiments thereof, it will be apparent to those of ordinary skill in the art that various changes and modifications may be made thereto without departing from the spirit and scope of inventive concepts as set forth in the following claims.

What is claimed is:

1. A memory device comprising:

a cell region; and a peripheral circuit region at least partially overlapping the cell region when viewed in plan view, wherein the peripheral circuit region includes, a first sub-peripheral circuit region including a substrate and a first circuit element on the substrate, a second sub-peripheral circuit region stacked on the first sub-peripheral circuit region in a vertical direction, the second sub-peripheral circuit region including a sub-poly structure and a second circuit element on and in the sub-poly structure, the second circuit element includes a polysilicon channel and a gate oxide, the second circuit element having a threshold voltage greater in absolute value than that of the first circuit element and an oxide thickness greater than that of the first circuit element.

2. The memory device of claim 1, wherein the sub-poly structure includes doped polysilicon.

3. The memory device of claim 1, wherein the first circuit element and the second circuit element are electrically connected with a through-electrode penetrating the sub-poly structure in the vertical direction.

4. The memory device of claim 3, wherein the through-electrode is electrically insulated from the sub-poly structure by a through-electrode insulating layer at least partially surrounding a side surface of the through-electrode.

5. The memory device of claim 3, wherein the first circuit element includes, first and second impurity regions that are in the substrate, first and second metal contacts connected to the first and second impurity regions, respectively, and a first gate pattern between the first and second metal contacts, the second circuit element includes, third and fourth impurity regions that are in the sub-poly structure, third and fourth metal contacts connected to the third and fourth impurity regions, respectively, and a second gate pattern between the third and fourth metal contacts, and a distance between the first and second metal contacts is shorter than a distance between the third and fourth metal contacts.

6. The memory device of claim 3, wherein the first circuit element includes, first and second impurity regions that are in the substrate, first and second metal contacts connected to the first and second impurity regions, respectively, and a first gate pattern between the first and second metal contacts, the second circuit element includes, third and fourth impurity regions that are in a well region in the sub-poly structure, third and fourth metal contacts connected to the third and fourth impurity regions, respectively, and a second gate pattern between the third and fourth metal contacts, and a distance between the first and second metal contacts is equal to a distance between the third and fourth metal contacts.

7. The memory device of claim 1, wherein the peripheral circuit region further includes a third sub-peripheral circuit region stacked on the cell region in the vertical direction, and the third sub-peripheral circuit region includes a second sub-poly structure that is different from the sub-poly structure, and a third circuit element that is on the second sub-poly structure.

8. The memory device of claim 7, wherein the cell region includes a plurality of word lines stacked on one surface of the second sub-poly structure, and the third circuit element of the third sub-peripheral circuit region is arranged on an opposite surface of the second sub-poly structure.

9. The memory device of claim 8, wherein the second sub-poly structure has a plate shape parallel to the substrate and is provided as a common source line for the cell region.

10. The memory device of claim 8, wherein the third circuit element of the third sub-peripheral circuit region is connected to a metal line of the cell region by a through-contact plug that penetrates the second sub-poly structure and the plurality of word lines.

11. The memory device of claim 7, wherein the third circuit element of the third sub-peripheral circuit region is connected to the second circuit element of the second sub-peripheral circuit region through a contact plug arranged on one side of the second sub-poly structure.

12. The memory device of claim 7, wherein the third circuit element of the third sub-peripheral circuit region is connected to the second circuit element of the second sub-peripheral circuit region by a through-contact plug that penetrates the second sub-poly structure.

13. The memory device of claim 1, wherein the second circuit element on the sub-poly structure includes a gate pattern, and both the gate pattern and the sub-poly structure include doped silicon.

14. The memory device of claim 1, wherein the cell region is arranged in a first chip, the peripheral circuit region is arranged in a second chip different from the first chip, and the first chip and the second chip are connected to each other by a bond.

15. The memory device of claim 1, wherein the cell region and the peripheral circuit region are arranged as a cell-over-periphery (COP) structure.

16. A memory device comprising:

a first chip having a peripheral circuit region arranged therein; and a second chip connected with the first chip by a bond to at least partially overlap the first chip on a plane, the second chip having a cell region arranged therein, wherein the peripheral circuit region includes, a first sub-peripheral circuit region including a substrate and a first circuit element on the substrate, a second sub-peripheral circuit region stacked on the first sub-peripheral circuit region in a vertical direction, the second sub-peripheral circuit region including a first sub-poly structure and a second circuit element on the first sub-poly structure, and a third sub-peripheral circuit region stacked on the second sub-peripheral circuit region in the vertical direction, the third sub-peripheral circuit region including a second sub-poly structure and a third circuit element on the second sub-poly structure, and wherein the substrate is a silicon substrate, the first sub-poly structure and the second sub-poly structure include doped polysilicon, and the second circuit element includes a polysilicon channel and a gate oxide, the second circuit element having a threshold voltage greater in absolute value than that of the first circuit element and an oxide thickness greater than that of the first circuit element.

17. The memory device of claim 16, wherein the second chip further includes a fourth sub-peripheral circuit region stacked on the cell region in the vertical direction, the fourth sub-peripheral circuit region includes a third sub-poly structure and a fourth circuit element on the third sub-poly structure, and the third sub-poly structure is provided as a common source line for the cell region.

18. The memory device of claim 16, wherein the first circuit element is a first transistor having a first threshold voltage, the second circuit element is a second transistor having a second threshold voltage, the third circuit element is a third transistor having a third threshold voltage, the second threshold voltage and the third threshold voltage both greater in absolute value than the first threshold voltage.

19. A memory device comprising:

a first sub-peripheral circuit region including a substrate and a first circuit element on and in the substrate;

a second sub-peripheral circuit region vertically stacked on the first sub-peripheral circuit region, the second sub-peripheral circuit region including a first sub-poly structure and a second circuit element on and in the first sub-poly structure;

a third sub-peripheral circuit region vertically stacked on the second sub-peripheral circuit region, the third sub-peripheral circuit region including a second sub-poly structure and a third circuit element on the second sub-poly structure; and a cell region vertically stacked on the third sub-peripheral circuit region, the cell region including a third sub-poly structure and a plurality of word lines vertically stacked on the third sub-poly structure, wherein the second circuit element includes a polysilicon channel and a gate oxide, the second circuit element having a threshold voltage greater in absolute value than that of the first circuit element and an oxide thickness greater than that of the first circuit element.

20. The memory device of claim 19, wherein the first circuit element is a first transistor having a first threshold voltage, the second circuit element is a second transistor having a second threshold voltage, and the third circuit element is a transistor having a third threshold voltage, the second threshold voltage and the third threshold voltage both greater in absolute value than the first threshold voltage.

* * * * *